(12) United States Patent
Jang et al.

(10) Patent No.: US 11,527,445 B2
(45) Date of Patent: Dec. 13, 2022

(54) SEMICONDUCTOR DEVICES AND METHODS OF MANUFACTURING THEREOF

(71) Applicant: Taiwan Semiconductor Manufacturing Company Limited, Hsinchu (TW)

(72) Inventors: Shu-Uei Jang, Hsinchu (TW); Shu-Yuan Ku, Zhubei (TW); Shih-Yao Lin, New Taipei (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 31 days.

(21) Appl. No.: 17/007,555

(22) Filed: Aug. 31, 2020

(65) Prior Publication Data
US 2022/0068720 A1    Mar. 3, 2022

(51) Int. Cl.
*H01L 29/161* (2006.01)
*H01L 29/165* (2006.01)
*H01L 21/8234* (2006.01)
*H01L 27/088* (2006.01)
*H01L 27/092* (2006.01)

(52) U.S. Cl.
CPC ........ *H01L 21/823481* (2013.01); *H01L 21/823431* (2013.01); *H01L 27/0886* (2013.01); *H01L 27/0924* (2013.01)

(58) Field of Classification Search
None
See application file for complete search history.

(56) References Cited

U.S. PATENT DOCUMENTS

2019/0067446 A1* 2/2019 Ching ............... H01L 29/6681
2019/0165155 A1* 5/2019 Chang .............. H01L 21/76229

* cited by examiner

*Primary Examiner* — Joseph C. Nicely
*Assistant Examiner* — Lamont B Koo
(74) *Attorney, Agent, or Firm* — Foley & Lardner LLP

(57) ABSTRACT

A semiconductor device includes a first transistor, a second transistor, a third transistor, and a fourth transistor. The first and second transistors operate under a lower gate voltage than the third and fourth transistors. The first transistor has a first active gate structure and the second transistor has a second active gate structure. The first and second active gate structures are separated by a first gate isolation structure along a first direction. The third transistor has a third active gate structure and the fourth transistor has a fourth active gate structure. The third and fourth active gate structures are separated by a second gate isolation structure along the first direction. The variation of a first distance between respective sidewalls of the first gate isolation structure is equal to the variation of a second distance between respective sidewalls of the second gate isolation structure along the first direction.

20 Claims, 28 Drawing Sheets

SEMICONDUCTOR DEVICES AND METHODS OF MANUFACTURING THEREOF

BACKGROUND

The present disclosure generally relates to semiconductor devices, and particularly to methods of making a non-planar transistor device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
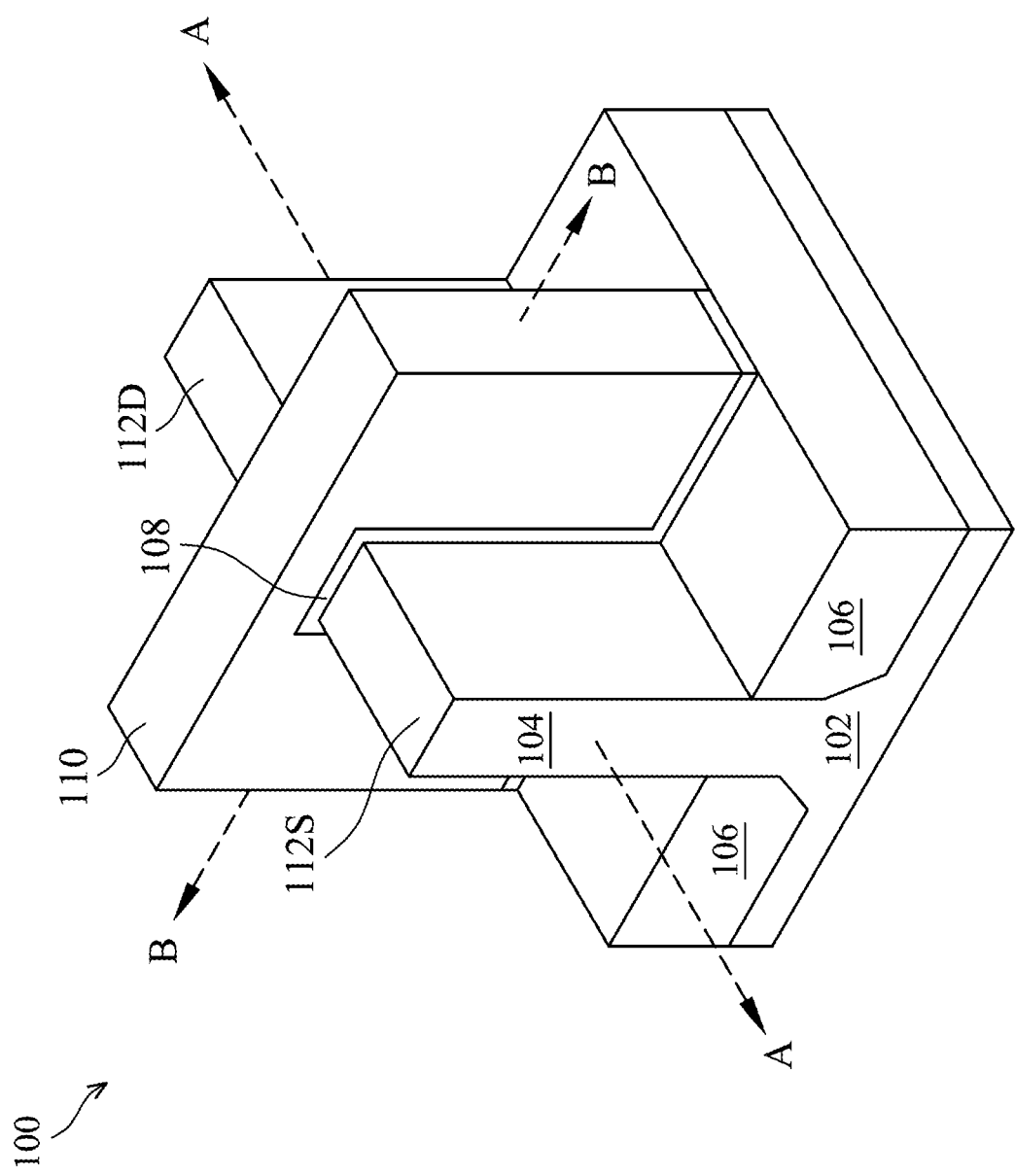
FIG. 1 illustrates a perspective view of a Fin Field-Effect Transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a FinFET device, and in particular, in the context of forming a replacement gate of a FinFET device. In some embodiments, a dummy gate structure is formed over a number of fins. The fins can include one or more active fins and one or more dummy fins. Hereinafter, the term "active fin" is referred to as a fin that will be adopted as an active channel to electrically conduct current in a finished semiconductor device (e.g., FinFET device 300 shown below), when appropriately configured and powered; and the term "dummy fin" is referred to as a fin that will not be adopted as an active channel (i.e., a dummy channel) to electrically conduct current in a finished semiconductor device (e.g., FinFET device 300 shown below). Next, gate spacers are formed around the dummy gate structure. After an interlayer dielectric (ILD) layer is formed around the gate spacers to overlay respective portions of the fins, a portion of the dummy gate structure over the at least one dummy fin is removed to form a gate cut trench. In various embodiments, a width of the gate cut trench is not necessarily in proportion (e.g., less than) to a width of the dummy fin. Next, such a gate cut trench is filled with a gate isolation structure. Next, the remaining portion of the dummy gate structure is replaced with an active gate structure, which can include one or more metal gate layers.

Metal gate layers over multiple fins formed by the above described method can provide various advantages in advanced processing nodes. The gate isolation structure is formed over the dummy fin to disconnect, intercept, cut, or otherwise separate the metal gate layers. Forming the gate isolation structure to cut metal gate layers can allow different portions of the metal gate layers to be electrically coupled to respective active fin(s).

In certain areas over a substrate, the active fins may be relatively sparsely disposed, which results in the dummy fin formed in these areas having a greater width; and in certain areas over the substrate, the active fins may be relatively densely disposed, which results in the dummy fins formed in these areas having a less width. The critical dimension (e.g., the width) of a gate cut trench formed by the existing technologies is typically proportional to the width of a dummy fin exposed by the gate cut trench, which causes various issues. For example, when forming the gate cut trenches over these different areas, the wider gate cut trench may not be successfully formed (e.g., with residual dummy gate structure left on the dummy fin). Accordingly, the metal gate layer cannot be successfully cut (isolated) by a gate isolation structure filling the gate cut trench.

The present disclosure provides various embodiments of semiconductor devices and the method of forming the same that address such issues. In various embodiments, over a substrate, some of the dummy fins are formed wider, and some of the dummy fins are formed narrower. Based on a width of the wider dummy fin, the width of a gate cut trench can be selectively formed to be in proportion or out of proportion to the width of the wider dummy fin. For example, when the width of the wider dummy fin is determined to be greater than a predefined threshold, the gate cut trench may be formed to be out of proportion to (e.g., less than) the width of the dummy fin. On the other hand, when the width of the wider dummy fin is determined to be equal to or less than the predefined threshold, the gate cut trench may be formed to be in proportion to the width of the dummy fin. In this way, respective gate cut trenches over the dummy fins having different dimensions can be concurrently formed, while significantly limiting the issues that the existing technologies are facing.

FIG. 1 illustrates a perspective view of an example FinFET device 100, in accordance with various embodiments. The FinFET device 100 includes a substrate 102 and a fin 104 protruding above the substrate 102. Isolation regions 106 are formed on opposing sides of the fin 104, with the fin 104 protruding above the isolation regions 106. A gate dielectric 108 is along sidewalls and over a top surface of the fin 104, and a gate 110 is over the gate dielectric 108. Source region 112S and drain region 112D are in (or extended from) the fin 104 and on opposing sides of the gate dielectric 108 and the gate 110. FIG. 1 is provided as a reference to illustrate a number of cross-sections in subsequent figures. For example, cross-section B-B extends along a longitudinal axis of the gate 110 of the FinFET device 100. Cross-section A-A is perpendicular to cross-section B-B and is along a longitudinal axis of the fin 104 and in a direction of, for example, a current flow between the source/drain regions 112S/112D. Subsequent figures refer to these reference cross-sections for clarity.

Figure 2:
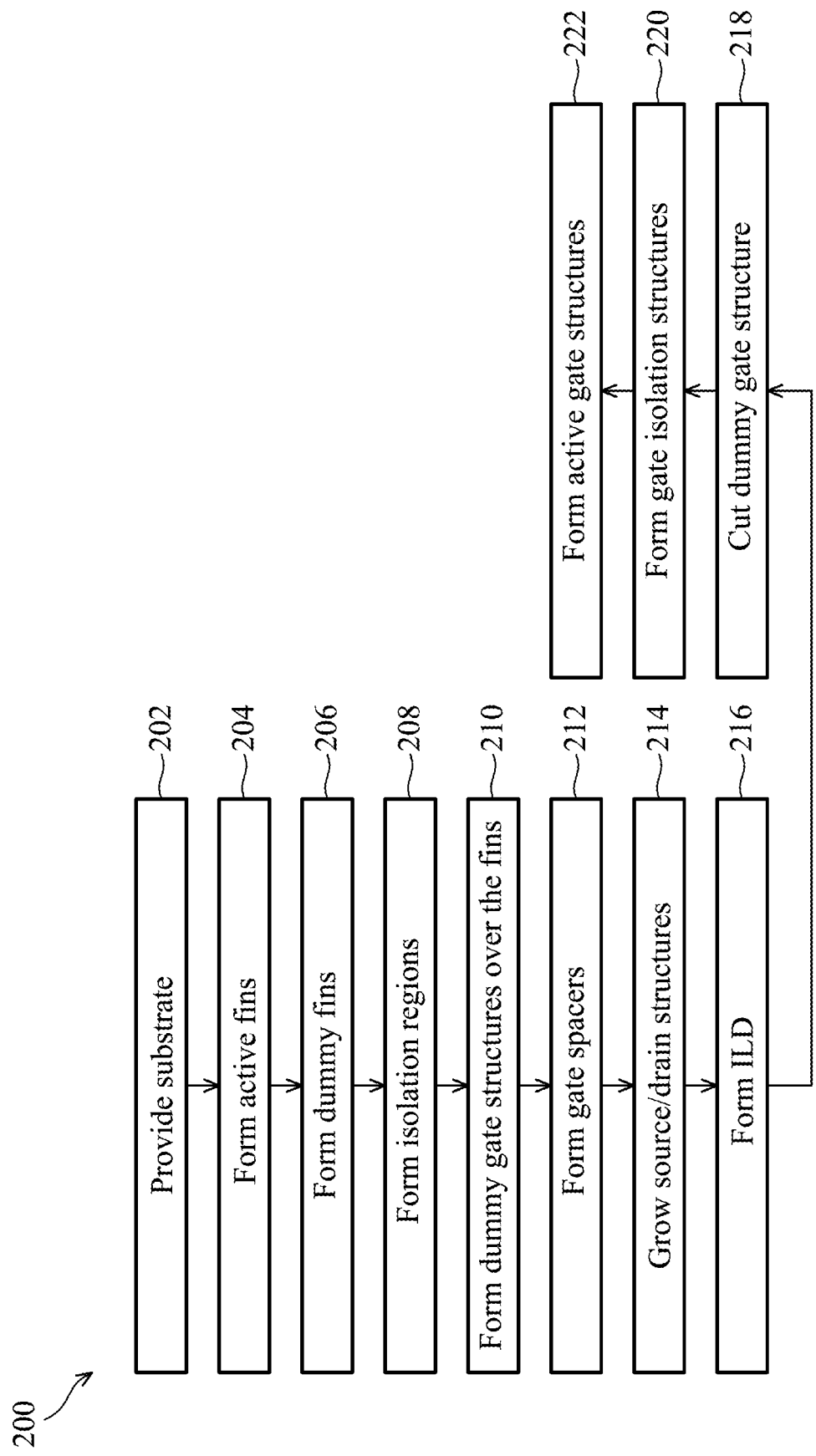
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device (e.g., FinFET device 100), a nanosheet transistor device, a nanowire transistor device, a vertical transistor device, a gate-all-around (GAA) transistor device, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example FinFET device at various fabrication stages as shown in FIGS. 3, 4, 5, 6, 7, 8, 9, 10, 11, 12, 13, 14A, 14B, 14C, 14D, 15A, 15B, 15C, 15D, 16A, 16B, 16C, and 16D, respectively, which will be discussed in further detail below.

In brief overview, the method 200 starts with operation 202 of providing a substrate. The method 200 continues to operation 204 of forming active fins. The method 200 continues to operation 206 of forming dummy fins. The method 200 continues to operation 208 of forming isolation regions. The method 200 continues to operation 210 of forming dummy gate structures over the fins. The method 200 continues to operation 212 of forming gate spacers. The method 200 continues to operation 214 of growing source/drain structures. The method 200 continues to operation 216 of forming an interlayer dielectric (ILD). The method 200 continues to operation 218 of cutting the dummy gate structures. The method 200 continues to operation 220 of forming gate isolation structures. The method 200 continues to operation 222 of forming active gate structures.

Figure 11:
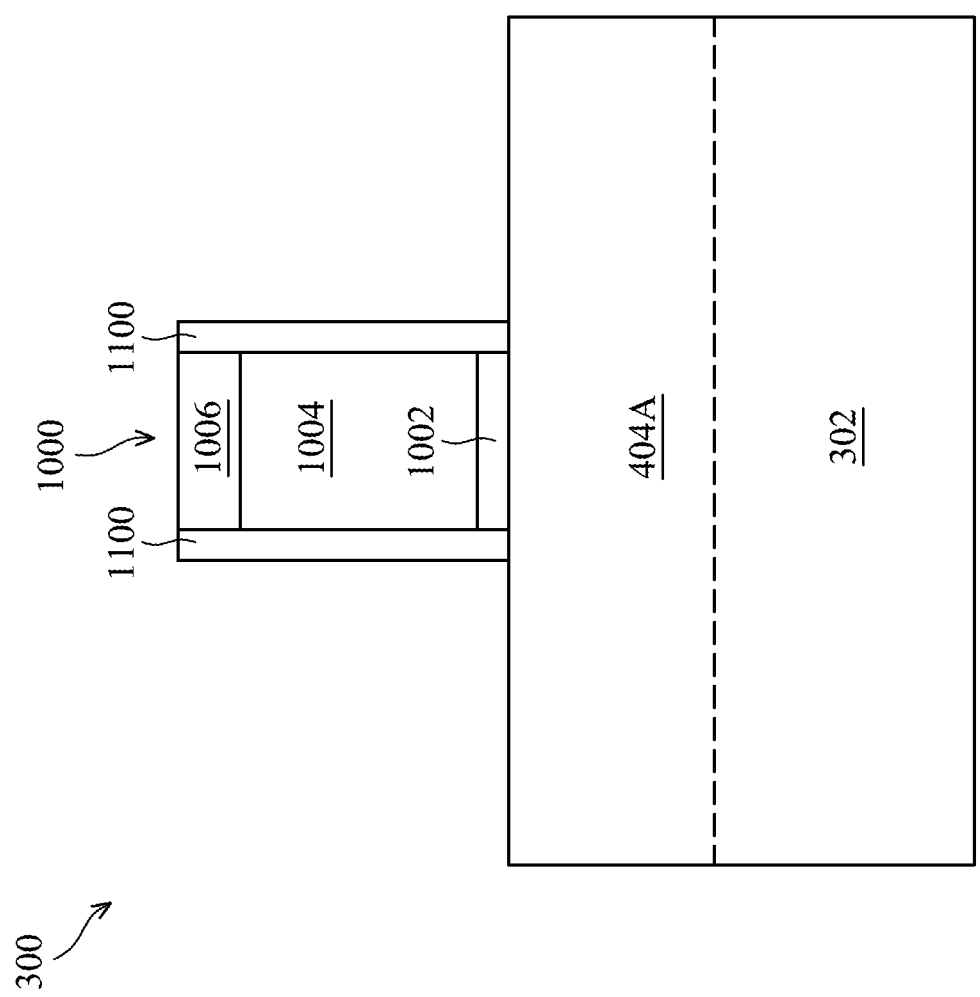
Figure 12:
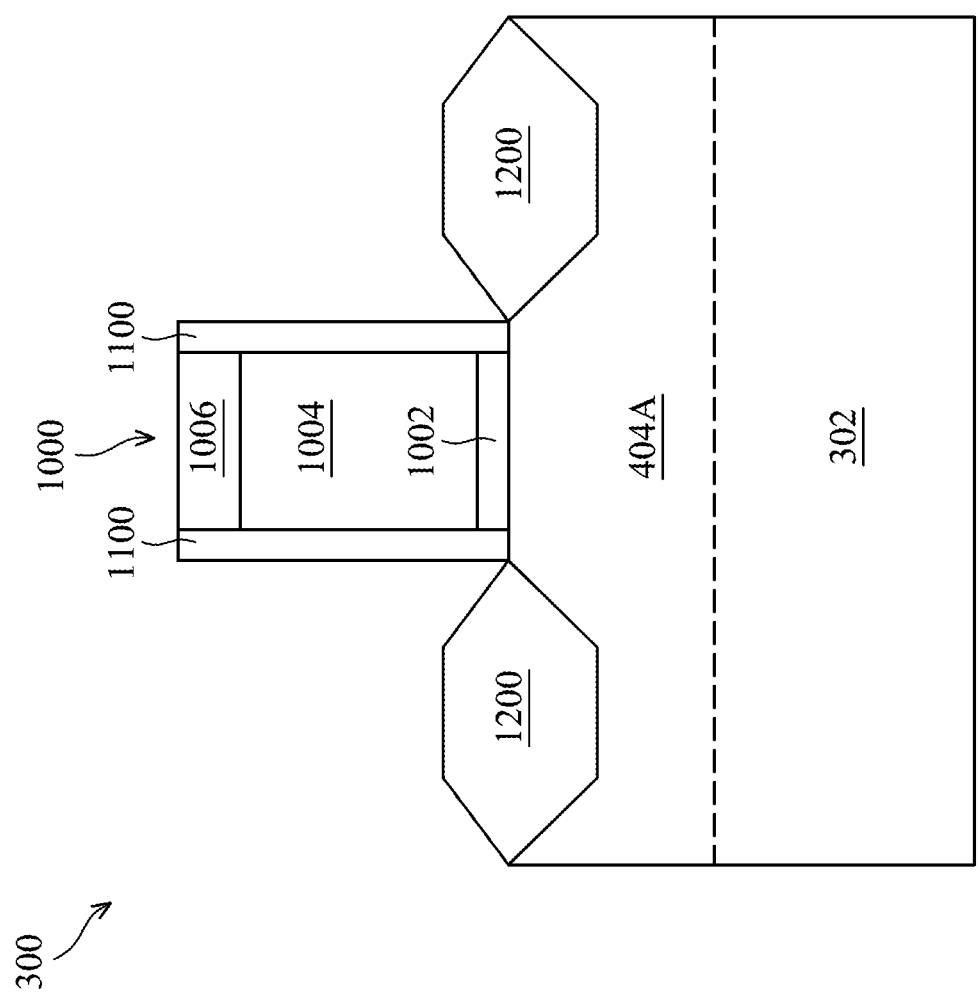
Figure 13:
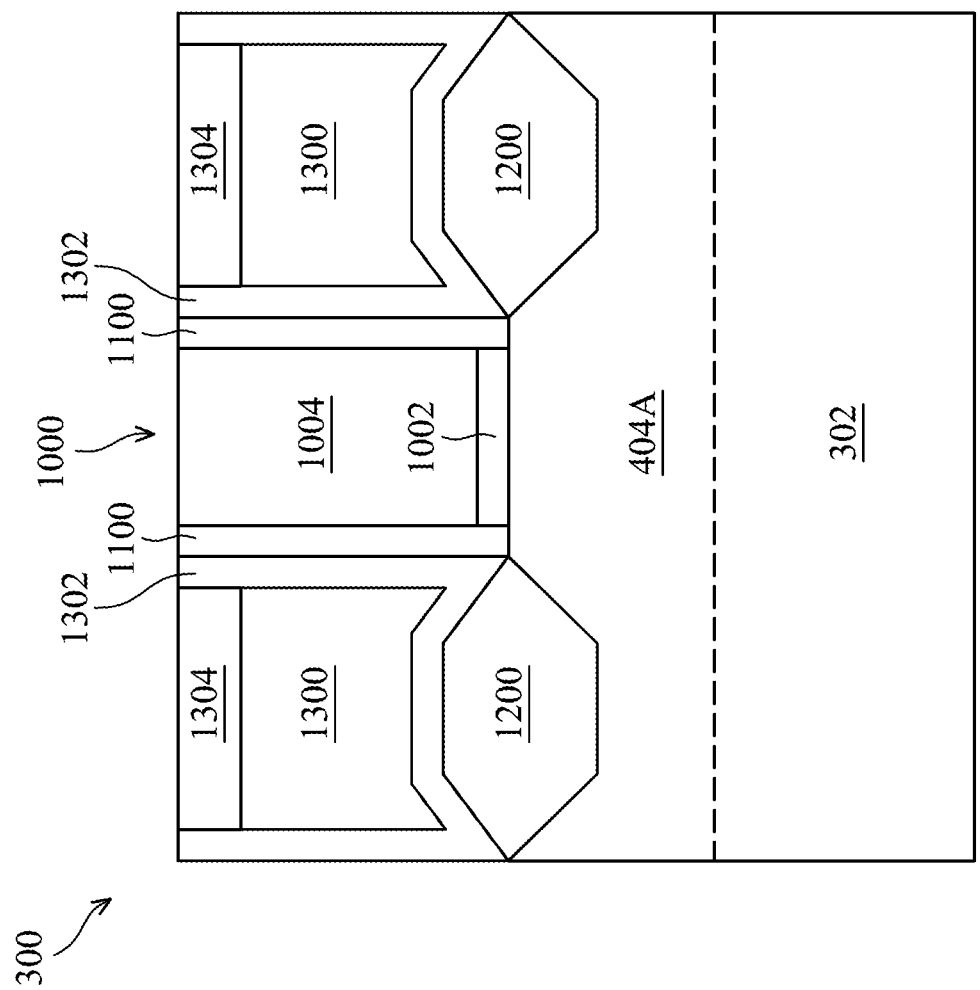

As mentioned above, FIGS. 3-16D each illustrate, in a cross-sectional view, a portion of a FinFET device 300 at various fabrication stages of the method 200 of FIG. 2. The FinFET device 300 is similar to the FinFET device 100 shown in FIG. 1, but with multiple fins. For example, FIGS. 3-10 and 14A-16D illustrate cross-sectional views of the FinFET device 300 along cross-section B-B (as indicated in FIG. 1); and FIGS. 11-13 illustrate cross-sectional views of the FinFET device 300 along cross-section A-A (as indicated in FIG. 1). Although FIGS. 3-16D illustrate the FinFET device 300, it is understood the FinFET device 300 may include a number of other devices such as inductors, fuses, capacitors, coils, etc., which are not shown in FIGS. 3-16D, for purposes of clarity of illustration.

Figure 3:
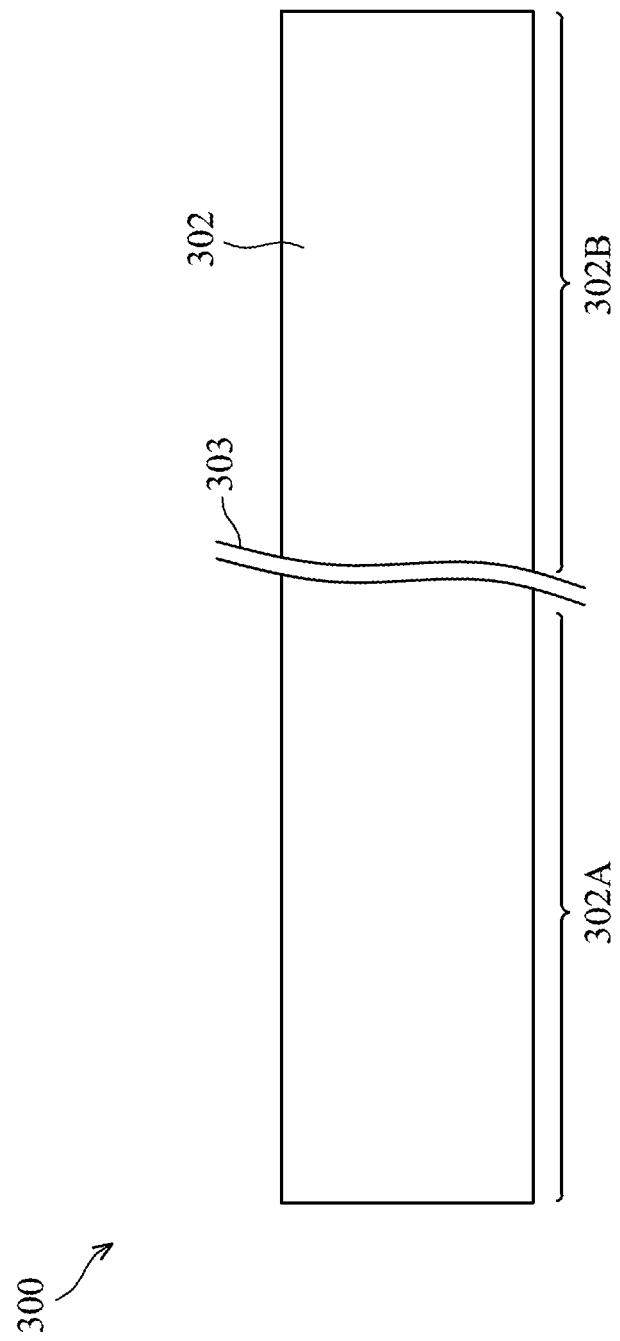
FIGS. 3, 4, 5, 6, 7, 8, 9, 10, 11, 12, 13, 14A, 14B, 14C, 14D, 15A, 15B, 15C, 15D, 16A, 16B, 16C, and 16D illustrate cross-sectional views of an example FinFET device (or a portion of the example FinFET device) during various fabrication stages, made by the method of FIG. 2, in accordance with some embodiments.

Corresponding to operation 202 of FIG. 2, FIG. 3 is a cross-sectional view of the FinFET device 300 including a semiconductor substrate 302 at one of the various stages of fabrication. The cross-sectional view of FIG. 3 is cut along the lengthwise direction of an active/dummy gate structure of the FinFET device 300 (e.g., cross-section B-B indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP, or combinations thereof.

In some embodiments, the FinFET device 300 can include areas 302A and 302B. The area 302A can be configured to form a number of input/output (I/O) transistors (hereinafter "I/O area 302A"); and the area 302B can be configured to form a number of core transistors (hereinafter "core area 302B"). The terms "I/O transistor" and "core transistor," as used herein, may be generally referred to a transistor configured to operate under a relatively higher voltage (e.g., higher $V_{gs}$) and a transistor configured to operate under a relatively lower voltage (e.g., lower $V_{gs}$), respectively. Thus, it should be understood that the I/O transistor can include any of various other transistors operating under a relatively higher voltage and the core transistor can include any of various other transistors operating under a relatively lower voltage, while remaining within the scope of the present disclosure. The I/O transistor, when appropriately configured, may have a relatively thicker gate dielectric; and the core transistor, when appropriately configured, has a relatively thinner gate dielectric. Further, the I/O transistors may be formed in a first area of the substrate (e.g., I/O area 302A) with a relatively lower density of transistors; and the core transistors may be formed in a second area of the substrate (e.g., core area 302B) with a relatively higher density of transistors. As such, features (e.g., fins) in the I/O area 302A may be more sparsely formed, when compared to the features (e.g., fins) formed in the core area 302B.

As shown in FIG. 3 (and the following figures), the I/O area 302A and core area 302B are separated from each other by a divider 303, which can include additional features/components/devices that are omitted for simplicity. It should be appreciated that some of the operations of the method 200 may be concurrently performed in the I/O area 302A and core area 302B. For purposes of illustration, some of the feature(s) formed in the I/O area 302A and the core area 302B are hereinafter shown in the same figure that corresponds to one of the operations of the method 200.

Figure 4:
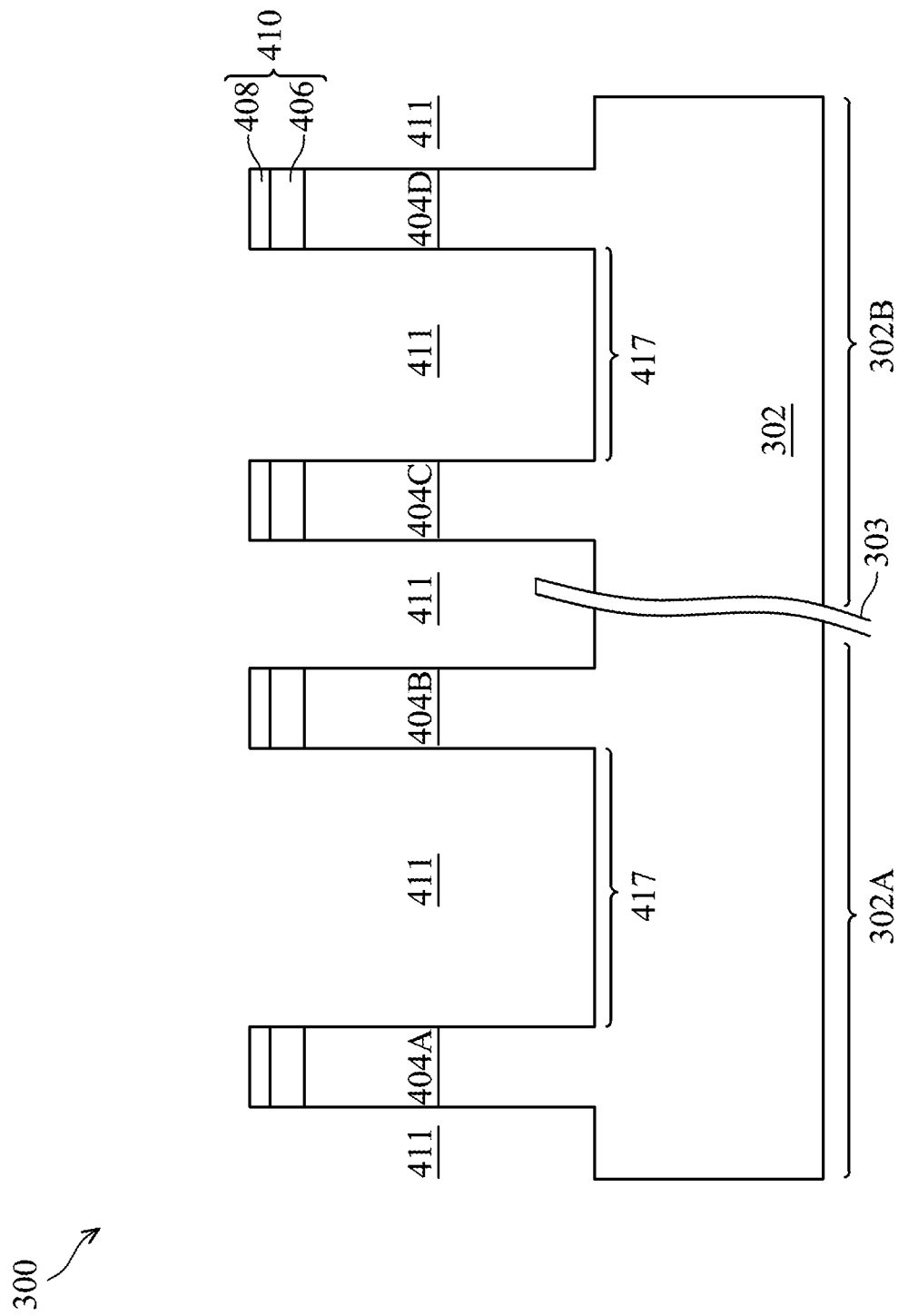

Corresponding to operation 204 of FIG. 2, FIG. 4 is a cross-sectional view of the FinFET device 300 including semiconductor fins 404A, 404B, 404C, and 404D at one of the various stages of fabrication. The cross-sectional view of FIG. 4 is cut along the lengthwise direction of an active/dummy gate structure of the FinFET device 300 (e.g., cross-section B-B indicated in FIG. 1).

The semiconductor fins 404A-B are formed in the I/O area 302A, and the semiconductor fins 404C-D are formed in the core area 302B. Although two semiconductor fins are shown in each of the I/O area 302A and core area 302B, it should be appreciated that the FinFET device 300 can include any number of semiconductor fins in each of the areas 302A and 302B while remaining within the scope of the present disclosure.

The semiconductor fins 404A-D may be each configured as an active fin, which will be adopted as an active (e.g., electrically functional) fin or channel in a completed Fin-FET. Further, the semiconductor fin 404A may be configured as the active channel of a first input/output (I/O) transistor of the FinFET device 300 (sometimes referred to as "active I/O fin 404A"); the semiconductor fin 404B may be configured as the active channel of a second input/output (I/O) transistor of the FinFET device 300 (sometimes referred to as "active I/O fin 404B"); the semiconductor fin 404C may be configured as the active channel of a first core transistor of the FinFET device 300 (sometimes referred to as "active core fin 404C"); and the fin 404D may be configured as the active channel of a second core transistor of the FinFET device 300 (sometimes referred to as "active core fin 404D").

The semiconductor fins 404A-D are formed by patterning the substrate 302 using, for example, photolithography and etching techniques. For example, a mask layer, such as a pad oxide layer 406 and an overlying pad nitride layer 408, is formed over the substrate 302. The pad oxide layer 406 may be a thin film comprising silicon oxide formed, for example, using a thermal oxidation process. The pad oxide layer 406 may act as an adhesion layer between the substrate 302 and the overlying pad nitride layer 408. In some embodiments, the pad nitride layer 408 is formed of silicon nitride, silicon oxynitride, silicon carbonitride, the like, or combinations thereof. Although only one pad nitride layer 408 is illustrated, a multilayer structure (e.g., a layer of silicon oxide on a layer of silicon nitride) may be formed as the pad nitride layer 408. The pad nitride layer 408 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 406 and pad nitride layer 408 to form a patterned mask 410, as illustrated in FIG. 4.

The patterned mask 410 is subsequently used to pattern exposed portions of the substrate 302 to form trenches (or openings) 411, thereby defining the active fins 404A-D between adjacent trenches 411 as illustrated in FIG. 4. When multiple fins are formed, such a trench may be disposed between any adjacent ones of the fins. In some embodiments, the active fins 404A-D are formed by etching trenches in the substrate 302 using, for example, reactive ion etch (ME), neutral beam etch (NBE), the like, or combinations thereof. The etch may be anisotropic. In some embodiments, the trenches 411 may be strips (viewed from the top) parallel to each other, and closely spaced with respect to each other. In some embodiments, the trenches 411 may be continuous and surround the active fins 404A-D.

The active fins 404A-D may be patterned by any suitable method. For example, the active fins 404A-D may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

As shown in FIG. 4, the active fins 404A-B in the I/O area 302A are formed to be separated from each other with a first spacing 417, and the active fins 404C-D in the core area 302B are formed to be separated from each other with a second spacing 419. In various embodiments, the first spacing 417 can be substantially greater than the second spacing 419. For example with a certain process node (e.g., 5 nanometers (nm)), the first spacing 417 can range from about 5 nanometers to about 500 nanometers, and the second spacing 419 can range from about 5 nanometers to about 500 nanometers.

FIGS. 3 and 4 illustrate an embodiment of forming the active fins 404A-D, but a fin may be formed in various different processes. For example, a top portion of the substrate 302 may be replaced by a suitable material, such as an epitaxial material suitable for an intended type (e.g., N-type or P-type) of semiconductor devices to be formed. Thereafter, the substrate 302, with epitaxial material on top, is patterned to form the active fins 404A-D that include the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the active fins 404A-D may include silicon germanium ($Si_xGe_{1-x}$, where x can be between 0 and 1), silicon carbide, pure or pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
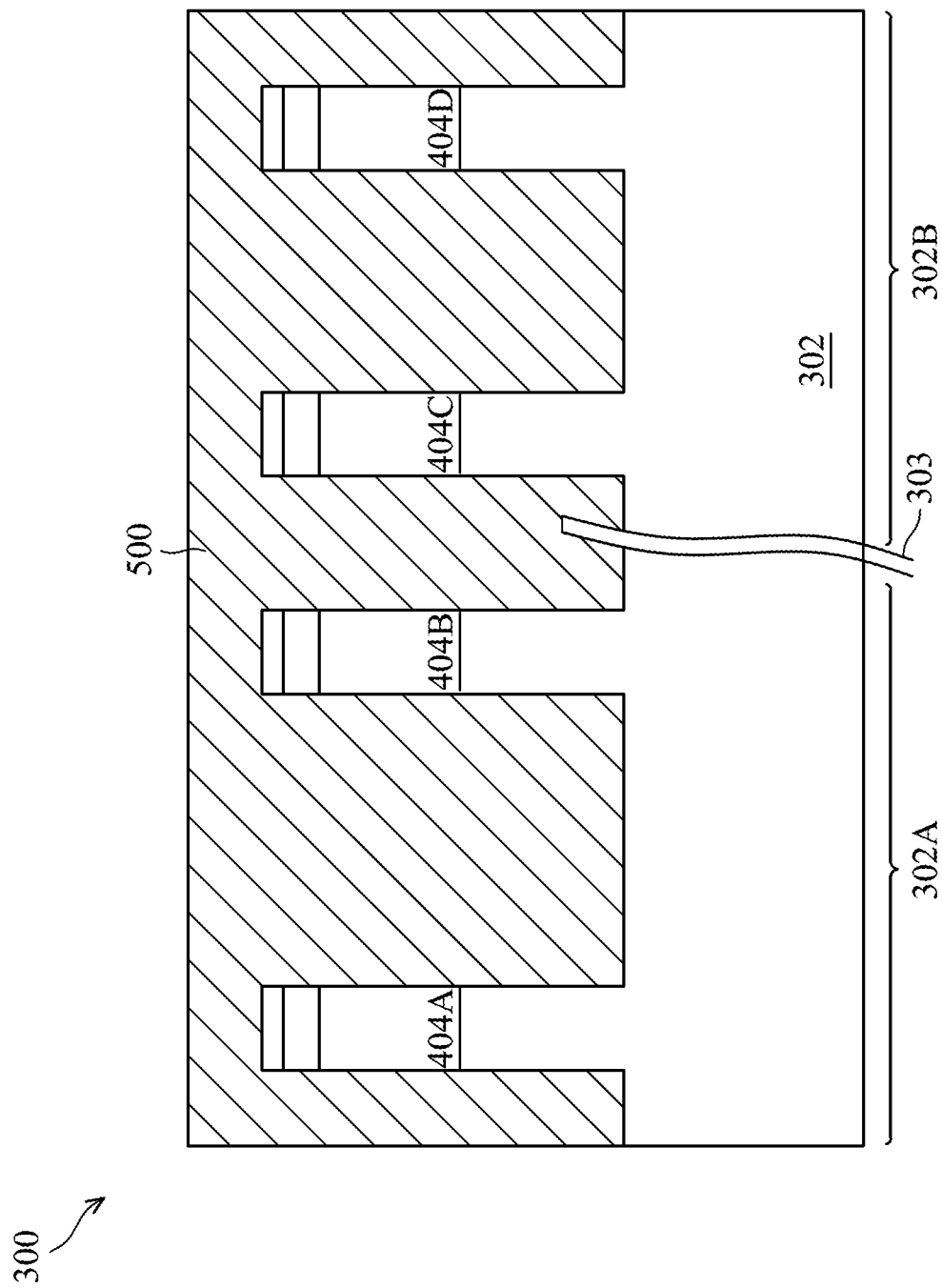
Figure 6:
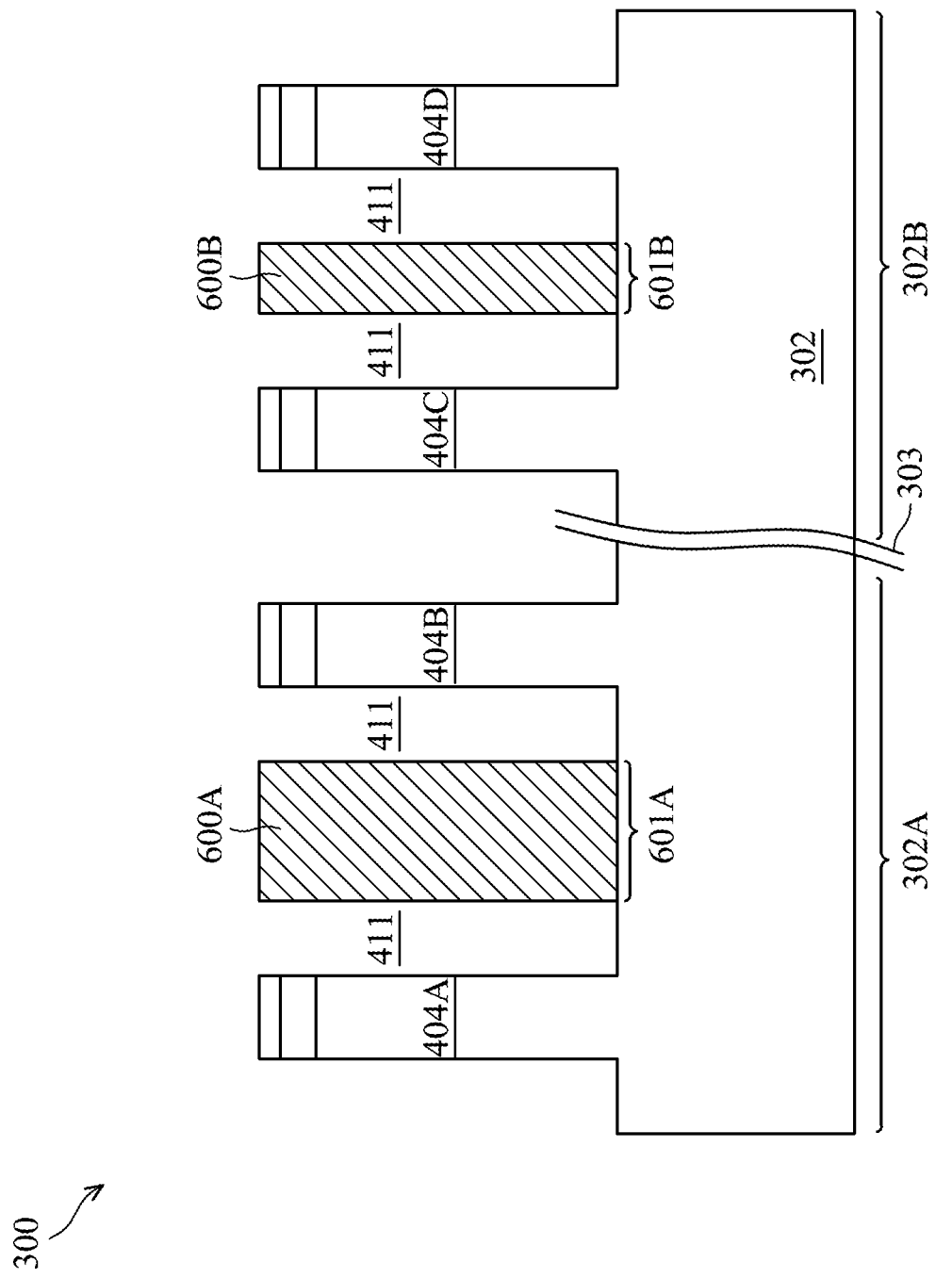

Corresponding to operation 206 of FIG. 2, FIG. 5 is a cross-sectional view of the FinFET device 300 including a dummy channel layer 500 at one of the various stages of fabrication at one of the various stages of fabrication, and FIG. 6 is a cross-sectional views of the FinFET device 300 including dummy fins 600A and 600B at one of the various stages of fabrication. The cross-sectional views of FIGS. 5 and 6 are each cut along the lengthwise direction of an active/dummy gate structure of the FinFET device 300 (e.g., cross-section B-B indicated in FIG. 1).

Although the dummy channel layer 500 is shown as being universally deposited over both of the areas 302A and 302B, it should be understood that similar dummy channel layers may be deposited over the I/O area 302A and the core area 302B, respectively.

In some embodiments, the dummy channel layer 500 can include a dielectric material used to form the dummy fins 600A-B. For example, the dielectric material may include silicon oxide, silicon nitride, silicon oxynitride, silicon carbide, silicon carbonitride, silicon oxycarbonitride, silicon oxycarbide, or combinations thereof. In another example, the dielectric material may include group IV-based oxide or group IV-based nitride, e.g., tantalum nitride, tantalum oxide, hafnium oxide, or combinations thereof. The dummy channel layer 500 may be formed using low-pressure chemical vapor deposition (LPCVD) or plasma enhanced chemical vapor deposition (PECVD), for example.

Upon depositing the dummy channel layer 500 overlaying the active fins 404A-D, one or more dummy fins, e.g., 600A and 600B, may be formed between the active fins 404A-D. For example, the dummy fin 600A may be formed between the active fins 404A-B; and the dummy fin 600B may be formed between the active fins 404C-D. The dummy fins 600A-B are formed by patterning the dummy channel layer 500 using, for example, photolithography and etching techniques. For example, a patterned mask (not shown) may be formed over the dummy channel layer 500 to mask portions of the dummy channel layer 500 to form the dummy fins 600A-B. Subsequently, unmasked portions of the dummy channel layer 500 may be etched using, for example, reactive ion etch (RIE), neutral beam etch (NBE), the like, or combinations thereof, thereby defining the dummy fins 600A-B between adjacent active fins 404A-D (or in the trenches 411) as illustrated in FIG. 6. The etch may be anisotropic, in some embodiments. In some other embodiments, the dummy fins 600A-B may be formed concurrently with or subsequently to forming isolation regions (e.g., 700 of FIG. 7) between adjacent fins, which will be discussed below.

As illustrated in FIG. 6, the dummy fin 600A formed in the I/O area 302A has a width (along a direction perpendicular to a lengthwise direction of the fins) 601A, and the dummy fin 600B formed in the core area 302B has a width (along the same direction) 601B. In various embodiments, the width 601A is substantially greater than the width 601B. For example with a certain process node (e.g., 5 nanometers (nm)), the width 601A can range from about 2 nanometers to about 200 nanometers, and the width 601B can range from about 2 nanometers to about 200 nanometers.

Figure 7:
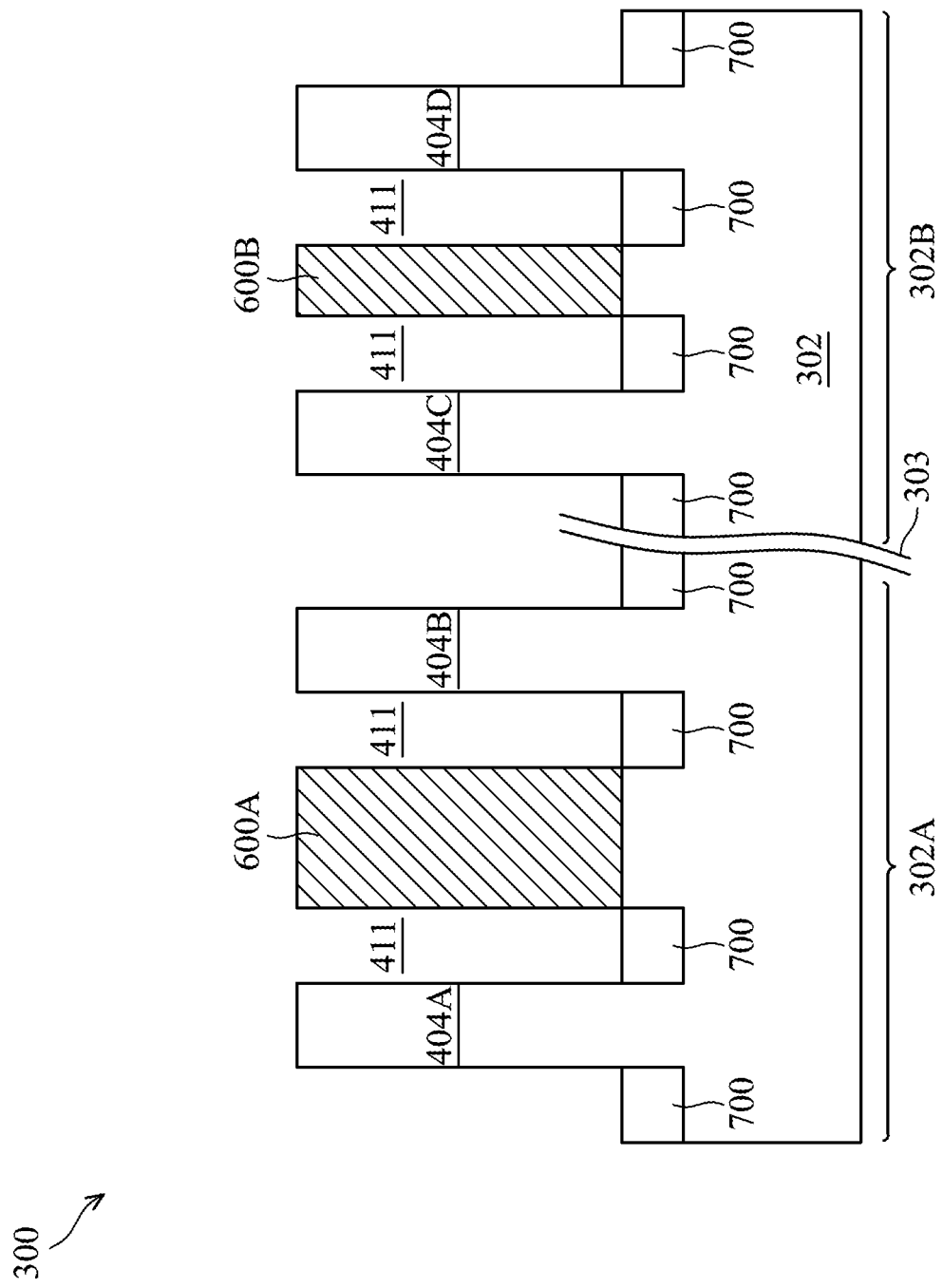

Corresponding to operation 208 of FIG. 2, FIG. 7 is a cross-sectional view of the FinFET device 300 including isolation regions 700 at one of the various stages of fabrication. The cross-sectional view of FIG. 7 is cut along the lengthwise direction of an active/dummy gate structure of the FinFET device 300 (e.g., cross-section B-B indicated in FIG. 1).

The isolation regions 700, which are formed of an insulation material, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 700 and a top surface of the fins 404A-D and 600A-B that are coplanar (not shown). The patterned mask 410 (FIG. 4) may also be removed by the planarization process.

In some embodiments, the isolation regions 700 include a liner, e.g., a liner oxide (not shown), at the interface between each of the isolation regions 700 and the substrate 302 (active fins 404A-D). In some embodiments, the liner oxide is formed to reduce crystalline defects at the interface between the substrate 302 and the isolation region 700. Similarly, the liner oxide may also be used to reduce crystalline defects at the interface between the active fins 404A-D and the isolation region 700. The liner oxide (e.g., silicon oxide) may be a thermal oxide formed through a thermal oxidation of a surface layer of the substrate 302, although other suitable method may also be used to form the liner oxide.

Next, the isolation regions 700 are recessed to form shallow trench isolation (STI) regions 700, as shown in FIG. 7. The isolation regions 700 are recessed such that the upper portions of the fins 404A-D and 600A-B protrude from between neighboring STI regions 700. Respective top surfaces of the STI regions 700 may have a flat surface (as illustrated), a convex surface, a concave surface (such as dishing), or combinations thereof. The top surfaces of the STI regions 700 may be formed flat, convex, and/or concave by an appropriate etch. The isolation regions 700 may be recessed using an acceptable etching process, such as one that is selective to the material of the isolation regions 700. For example, a dry etch or a wet etch using dilute hydrofluoric (DHF) acid may be performed to recess the isolation regions 700.

Figure 8:
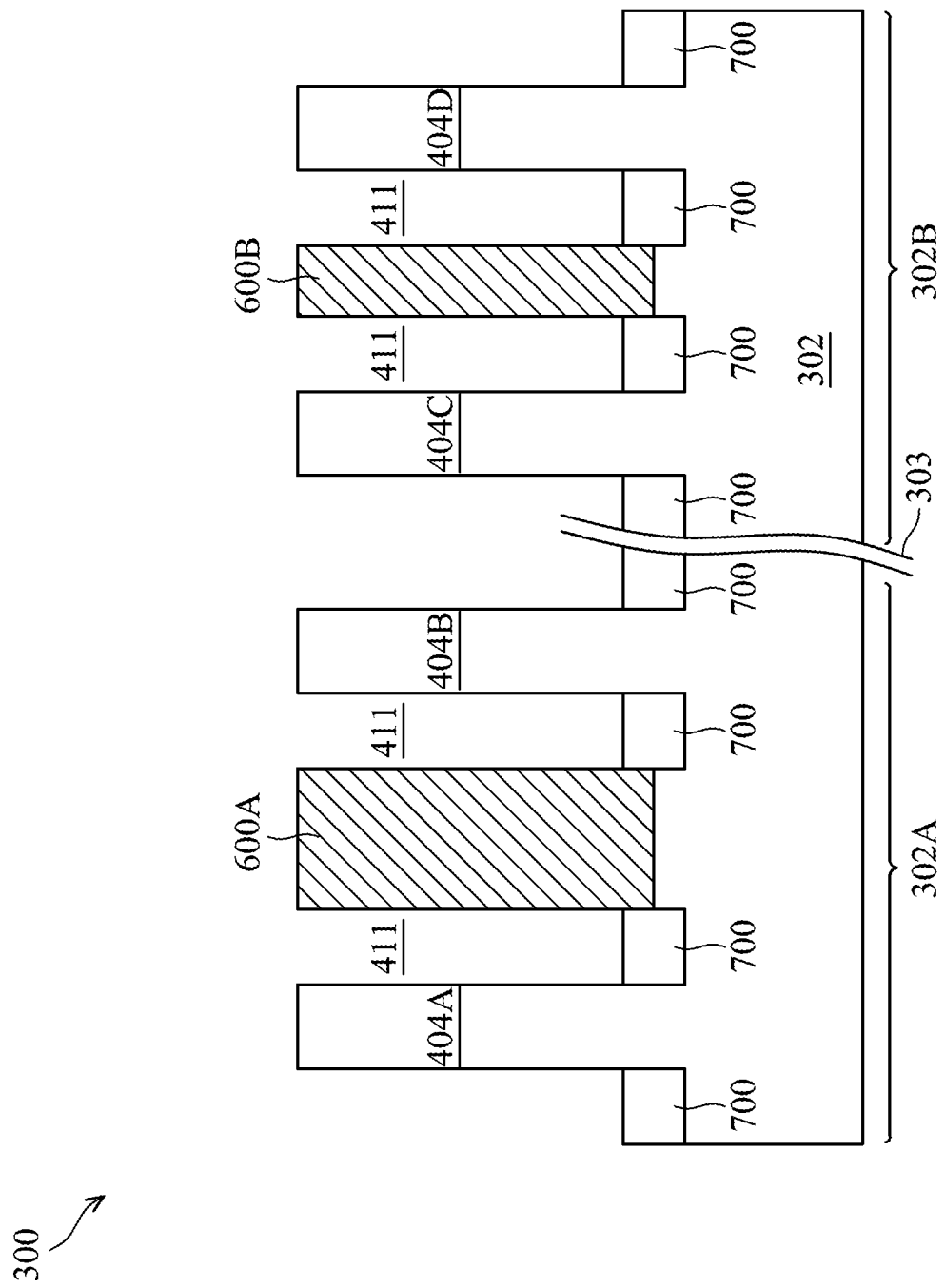

As mentioned above, the dummy fins 600A-B may be formed concurrently with or subsequently to the formation of the isolation regions 700. As an example, when forming the active fins 404A-D (FIG. 4), one or more other active fins may also be formed in the trenches 411. The insulation material of the isolation regions 700 may be deposited over the active fins, followed by a CMP process to planarize the top surfaces of the isolation regions 700 and the active fins, which include the active fins 404A-D and the active fins formed in the trenches 411. Subsequently, an upper portion of the active fins formed in the trenches 411 may be partially removed to form cavities. The cavities are then filled with the dielectric material of the dummy channel layer 500, followed by another CMP process to form the dummy fins 600A-B. The isolation regions 700 are recessed to form the shallow trench isolation (STI) regions 700, as shown in FIG. 8. Using such a method to form the dummy fins 600A-B, the dummy fins 600A-B are formed on the substrate 302 and a bottom surface of the dummy fins 600A-B is below the top surface of the isolation regions 700, as shown in FIG. 8. Depending on how much of the isolation regions 700 is recessed, the bottom surface of the dummy fins 600A-B may be above the top surface of the isolation regions 700, while remaining within the scope of the present disclosure.

Figure 9:
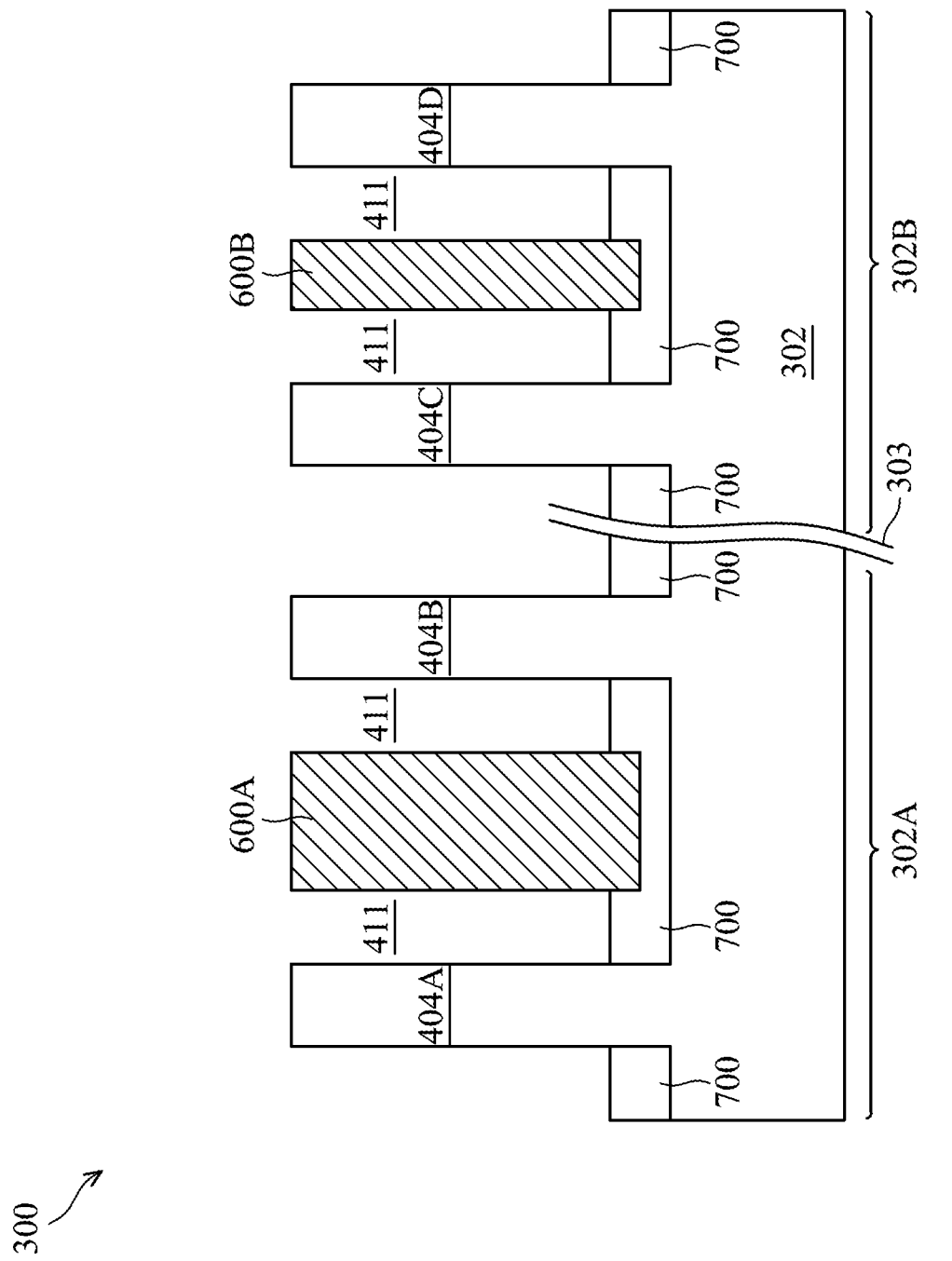

As another example, after forming the active fins 404A-D (FIG. 4), the insulation material of the isolation regions 700 may be deposited over the active fins 404A-D in a controlled deposition rate, thereby causing cavities to be spontaneously formed in the trenches 411. The cavities are then filled with the dielectric material of the dummy channel layer 500, followed by a CMP process to form the dummy fins 600A-B. The isolation regions 700 are recessed to form the shallow trench isolation (STI) regions 700, as shown in FIG. 9. Using such a method to form the dummy fins 600A-B, the dummy fins 600A-B are formed on the isolation regions 700 and a bottom surface of the dummy fins 600A-B is embedded in the corresponding isolation region 700, as shown in FIG. 9. As yet another example, after forming the active fins 404A-D (FIG. 4) and depositing the insulation material of the isolation regions 700 over the active fins 404A-D, a patterned mask may be formed over the isolation regions 700 to expose portions of the isolation regions 700 to form the dummy fins 600A-B (e.g., in the trenches 411). Subsequently, the exposed portions of the isolation regions 700 may be etched using, for example, reactive ion etch (RIE), neutral beam etch (NBE), the like, or combinations thereof, thereby defining cavities. The cavities are then filled with the dielectric material of the dummy channel layer 500, followed by a CMP process to form the dummy fins 600A-B, which is similar to the illustrated embodiment of FIG. 9.

Figure 10:
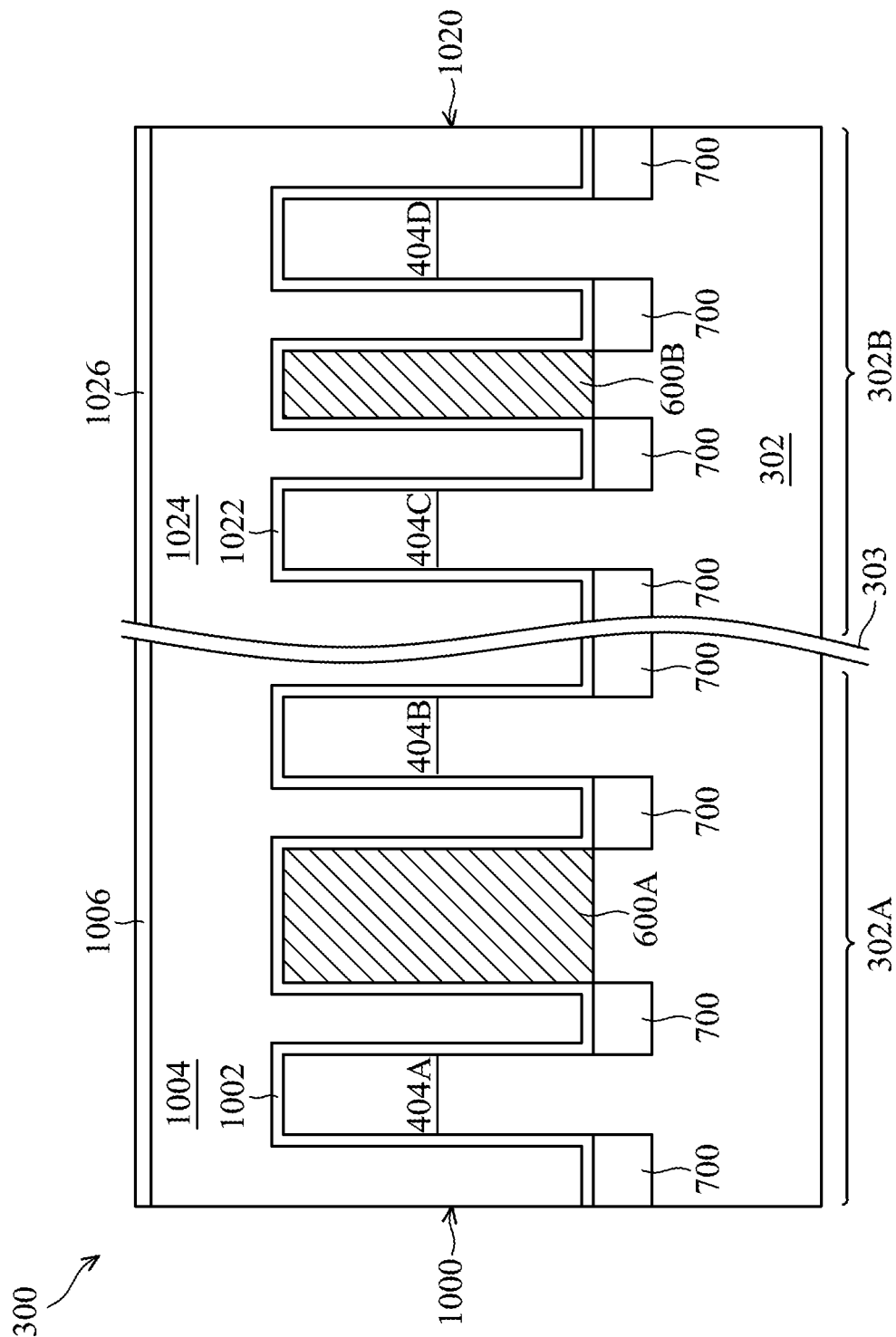

Corresponding to operation 210 of FIG. 2, FIG. 10 is a cross-sectional view of the FinFET device 300 including a dummy gate structure 1000 in the I/O area 302A and a dummy gate structure 1020 in the core area 302B at one of the various stages of fabrication. The cross-sectional view of FIG. 10 is cut along a lengthwise direction of the dummy gate structures 1000 and 1020 of the FinFET device 300 (e.g., cross-section B-B indicated in FIG. 1).

The dummy gate structure 1000 is formed to overlay a respective portion of each of the fins (e.g., active fins 400A-B, dummy fin 600A) in the core area 302B. Prior to, concurrently with, or subsequently to forming the dummy gate structure 1000 in the I/O area 302A, a dummy gate structure 1020 may be formed in the core area 302B to overlay a portion of each of the active fins 404C-D, and the dummy fin 600B. The dummy gate structure 1020 is similar to the dummy gate structure 1000, except for its dimensions, and thus, the dummy gate structure 1020 will be briefly discussed below.

The dummy gate structure 1000 includes a dummy gate dielectric 1002 and a dummy gate 1004, in some embodiments. A mask 1006 may be formed over the dummy gate structure 1000. To form the dummy gate structure 1000, a dielectric layer is formed on the active fins 404A-B and dummy fin 600A. The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown. Similarly, the dummy gate structure 1020 includes a dummy gate dielectric 1022 and a dummy gate 1024, with a mask 1026 formed thereon.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using suitable lithography and etching techniques to form the mask 1006 (1026). The pattern of the mask 1006 (1026) then may be transferred to the gate layer and the dielectric layer by a suitable etching technique to form the dummy gate 1004 (1024) and the underlying dummy gate dielectric 1002 (1022), respectively. The dummy gate 1004 and the dummy gate dielectric 1002 cover a respective portion (e.g., a channel region) of each of the active fins 404A-B and the dummy fin 600A; and the dummy gate 1024 and the dummy gate dielectric 1022 cover a portion (e.g., a channel region) of the active fins 404C-D and the dummy fin 600B. The dummy gate 1004 (1024) may also have a lengthwise direction (e.g., direction B-B of FIG. 1) perpendicular to the lengthwise direction (e.g., direction of A-A of FIG. 1) of the fins.

The dummy gate dielectric 1002 is shown to be formed over the active fins 404A-b and the dummy fin 600A (e.g., over the respective top surfaces and the sidewalls of the fins) and over the STI regions 700 in the example of FIG. 10. Similarly, the dummy gate dielectric 1022 is formed to overlay the active fins 404C-D and the dummy fin 600B (e.g., overlaying the respective top surfaces and the sidewalls of the fins). In other embodiments, the dummy gate dielectric 1002 (1022) may be formed by, e.g., thermal oxidation of a material of the fins, and therefore, may be formed over the fins but not over the STI regions 700. It should be appreciated that these and other variations are still included within the scope of the present disclosure.

FIGS. 11-13 illustrate the cross-sectional views of further processing (or making) of the FinFET device 300 along cross-section A-A of one of the active fins 404A-D (as indicated in FIG. 1). As a representative example, one dummy gate structures 1000 is illustrated over the active fin 404A in FIGS. 11-13. It should be appreciated that more than one dummy gate structure can be formed over the fin 404A (and each of the other fins, e.g., 404B-D, 600A-B), while remaining within the scope of the present disclosure.

Corresponding to operation 212 of FIG. 2, FIG. 11 is a cross-sectional view of the FinFET device 300 including gate spacer 1100 formed around (e.g., along and contacting the sidewalls of) the dummy gate structure 1000. For example, the gate spacer 1100 may be formed on opposing sidewalls of the dummy gate structure 1000. It should be understood that any number of gate spacers can be formed around the dummy gate structures 1000 while remaining within the scope of the present disclosure.

The gate spacer 1100 may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer 1100. The shapes and formation methods of the gate spacer 1100 as illustrated in FIG. 11 are merely non-limiting examples, and other shapes and formation methods are possible. These and other variations are fully intended to be included within the scope of the present disclosure.

Corresponding to operation 214 of FIG. 2, FIG. 12 is a cross-sectional view of the FinFET device 300 including a number of source/drain regions 1200 at one of the various stages of fabrication. The source/drain regions 1200 are formed in recesses of the active fin 404A adjacent to the dummy gate structures 1000, e.g., between adjacent dummy gate structures 1000 and/or next to a dummy gate structure 1000. The recesses are formed by, e.g., an anisotropic etching process using the dummy gate structures 1000 as an etching mask, in some embodiments, although any other suitable etching process may also be used.

The source/drain regions 1200 are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 12, the epitaxial source/drain structures 1200 may have surfaces raised from respective surfaces of the active fin 404A (e.g. raised above the non-recessed portions of the active fin 404A) and may have facets. In some embodiments, the source/drain structures 1200 of the adjacent fins may merge to form a continuous epitaxial source/drain structure (not shown). In some embodiments, the source/drain structures 1200 of the adjacent fins may not merge together and remain separate source/drain structures 1200 (not shown). In some embodiments, when the resulting FinFET device is an n-type FinFET, the source/drain structures 1200 can include silicon carbide (SiC), silicon phosphorous (SiP), phosphorous-doped silicon carbon (SiCP), or the like. In some embodiments, when the resulting FinFET device is a p-type FinFET, the source/drain structures 1200 comprise SiGe, and a p-type impurity such as boron or indium.

The epitaxial source/drain structures 1200 may be implanted with dopants to form source/drain structures 1200 followed by an annealing process. The implanting process may include forming and patterning masks such as a photoresist to cover the regions of the FinFET device 300 that are to be protected from the implanting process. The source/drain structures 1200 may have an impurity (e.g., dopant) concentration in a range from about $1 \times 10^{19}$ cm$^{-3}$ to about $1 \times 10^{21}$ cm$^{-3}$. P-type impurities, such as boron or indium, may be implanted in the source/drain structures 1200 of a P-type transistor. N-type impurities, such as phosphorous or arsenide, may be implanted in the source/drain structures 1200 of an N-type transistor. In some embodiments, the epitaxial source/drain structures 1200 may be in situ doped during their growth.

Corresponding to operation 216 of FIG. 2, FIG. 13 is a cross-sectional view of the FinFET device 300 including an interlayer dielectric (ILD) 1300 at one of the various stages of fabrication. In some embodiments, prior to forming the ILD 1300, a contact etch stop layer (CESL) 1302 is formed over the structure, as illustrated in FIG. 13. The CESL 1302 can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, the ILD 1300 is formed over the CESL 1302 and over the dummy gate structures 1000. In some embodiments, the ILD 1300 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 1300 is formed, an optional dielectric layer 1304 is formed over the ILD 1300. The dielectric layer 1304 can function as a protection layer to prevent or reduces the loss of the ILD 1300 in subsequent etching processes. The dielectric layer 1304 may be formed of a suitable material, such as silicon nitride, silicon carbonitride, or the like, using a suitable method such as CVD, PECVD, or FCVD. After the dielectric layer 1304 is formed, a planarization process, such as a CMP process, may be performed to achieve a level upper surface for the dielectric layer 1304. The CMP may also remove the mask 1006 and portions of the CESL 1302 disposed over the dummy gate 1004 (FIG. 12). After the planarization process, the upper surface of the dielectric layer 1304 is level with the upper surface of the dummy gate 1004, in some embodiments.

Figure 14A:
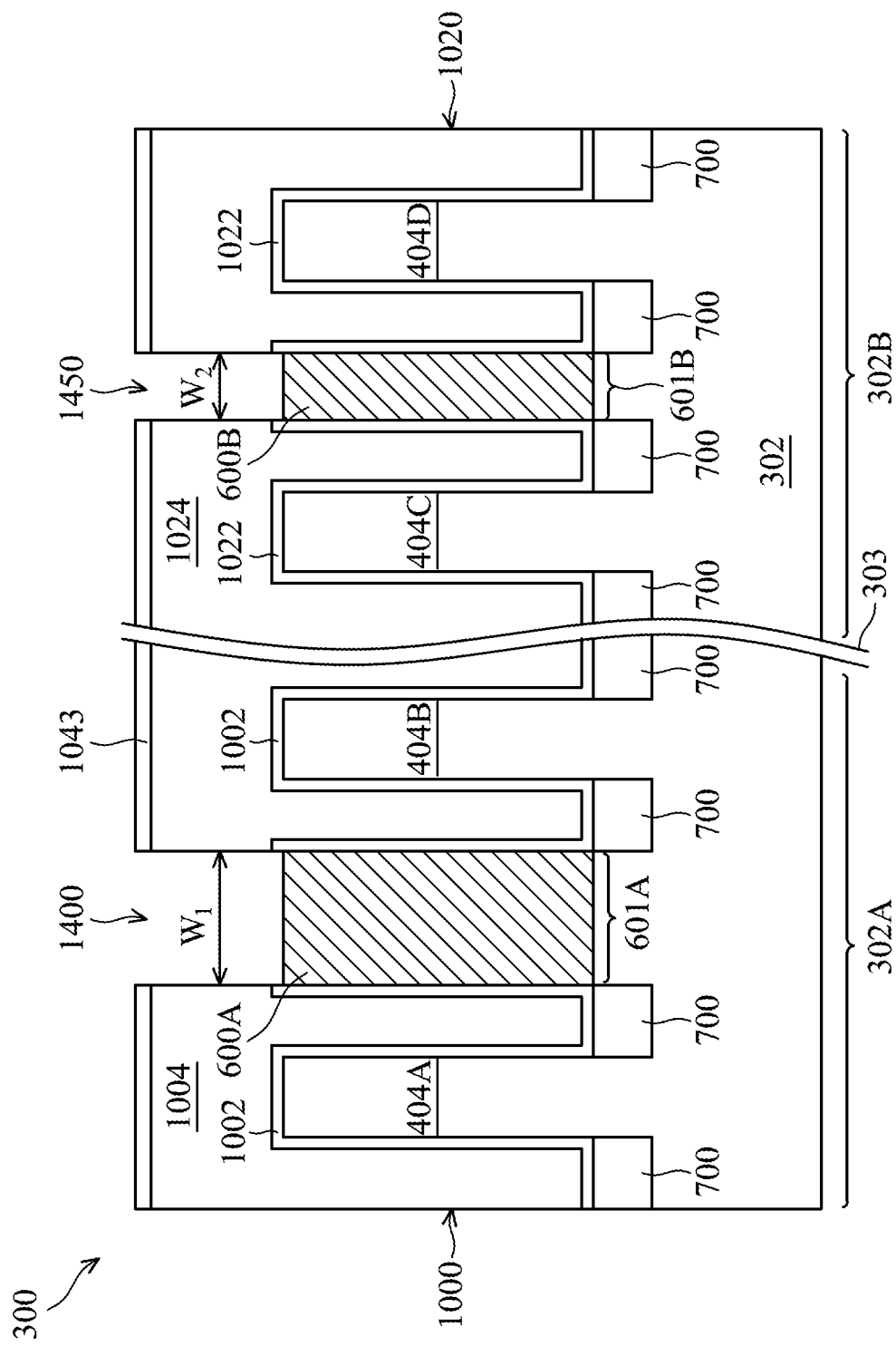

Corresponding to operation 218 of FIG. 2, FIG. 14A is a cross-sectional view of the FinFET device 300 in which the dummy gate structures 1000 and 1020 are respectively cut, intercepted, or otherwise disconnected to form a gate cut trench 1400 in the I/O area 302A and a gate cut trench 1450 in the core area 302B at one of the various stages of fabrication. Corresponding to the same operation, FIGS. 14B, 14C, and 14D each illustrate a cross-sectional view of the FinFET device 300 in which the gate cut trenches 1400 and/or 1450 have different profiles than FIG. 14A. The cross-sectional view of FIGS. 14A-D are each cut along the lengthwise direction of the dummy gate structures 1000 and 1020 of the FinFET device 300 (e.g., cross-section B-B indicated in FIG. 1).

To form the gate cut trench 1400, an etching process 1401, which can include one or more stages, may be performed to remove a portion of the dummy gate 1004 and a portion of the dummy gate dielectric 1002 that are disposed above the dummy fin 600A. Concurrently with forming the gate cut trench 1400, the same etching process may be performed to remove a portion of the dummy gate 1024 and a portion of the dummy gate dielectric 1022 that are disposed above the dummy fin 600B. During the first stage 1401, a mask 1403 may be formed over the dummy gate structures 1000 and 1020 to expose respective portions of the dummy gates 1004 and 1024 desired to be removed (e.g., the portion disposed over the dummy fins 600A-B), followed by the etching process. The mask 1403 may be continued to be used during the following stages (if any) of the etching process.

Figure 14B:
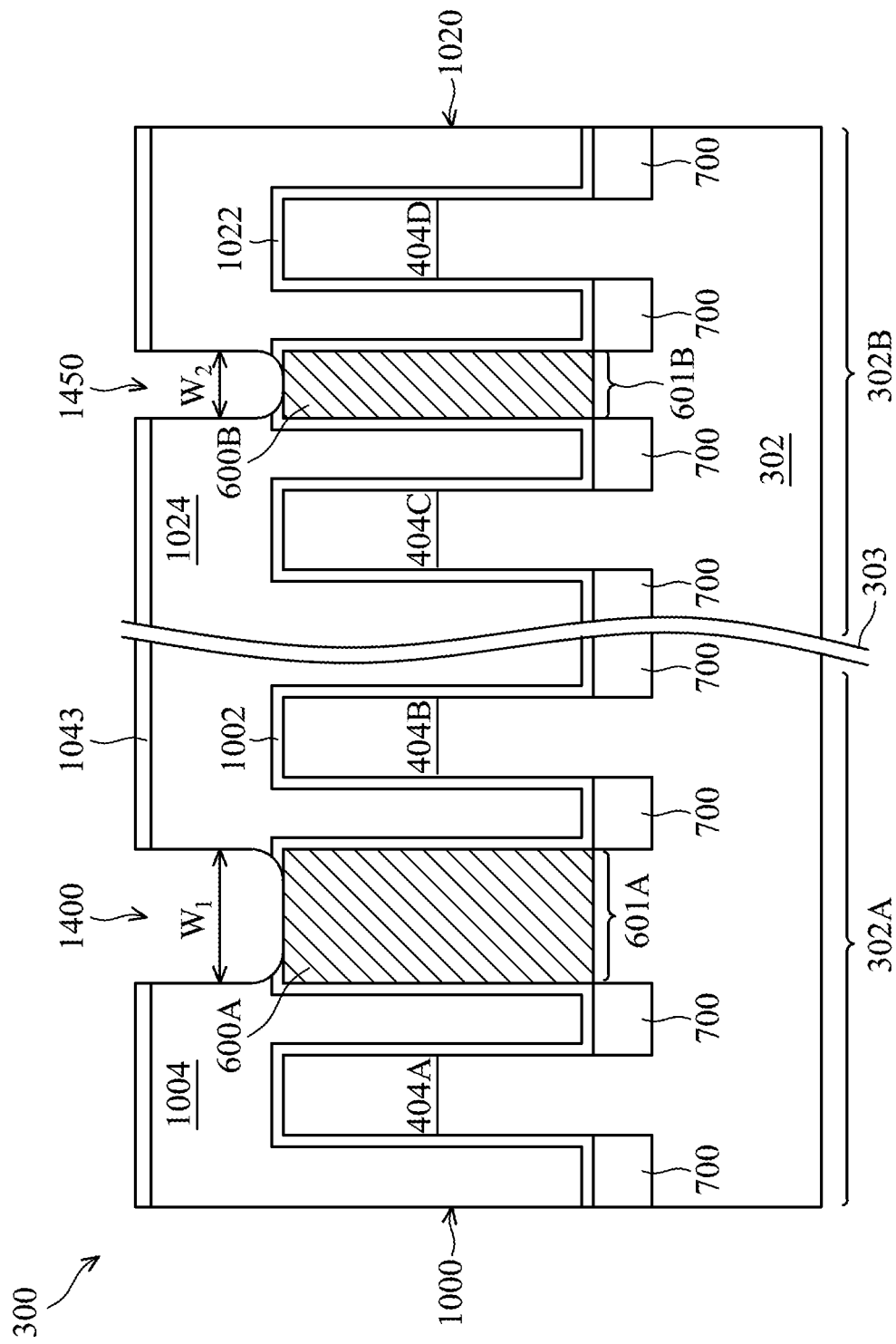
Figure 14C:
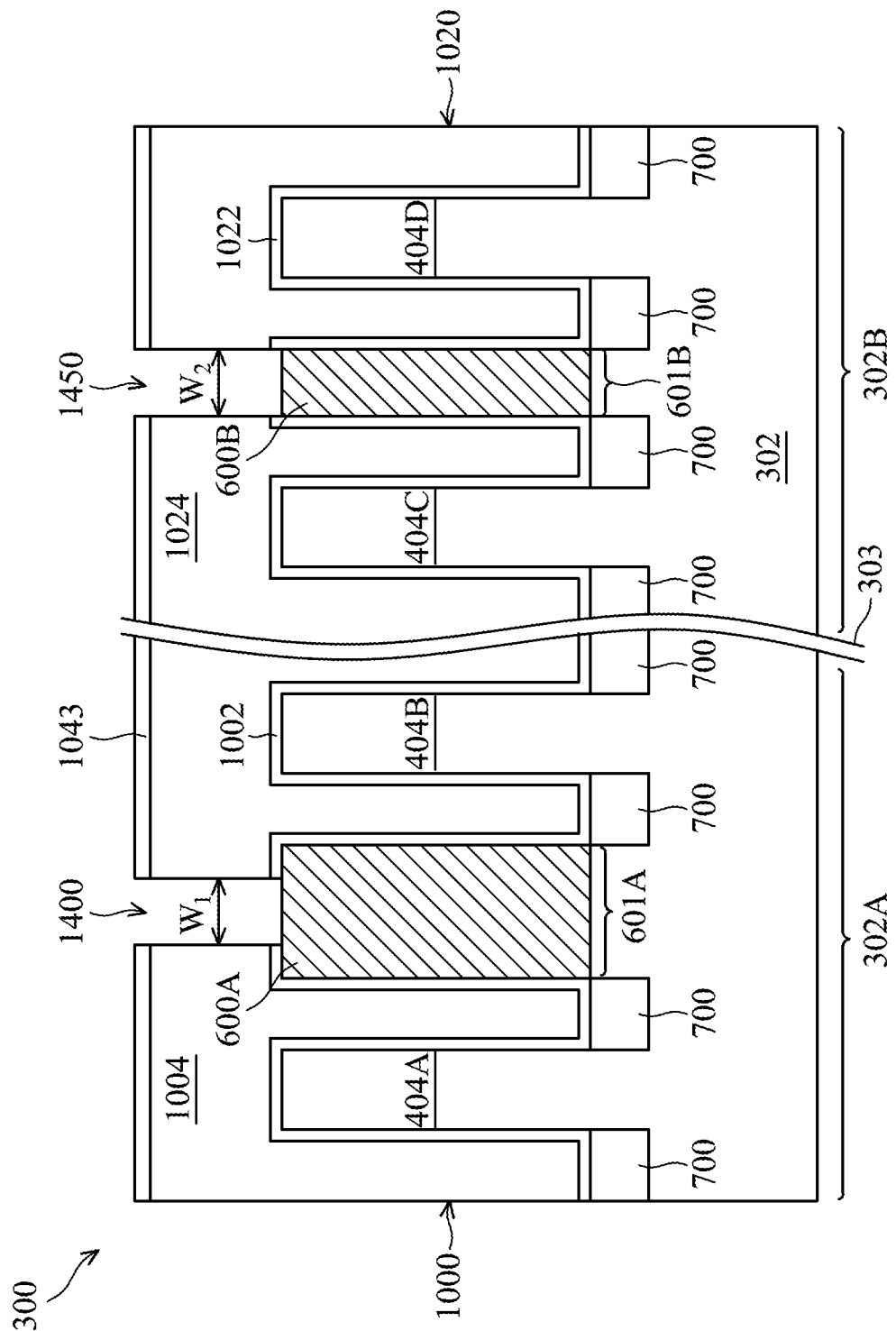
Figure 14D:
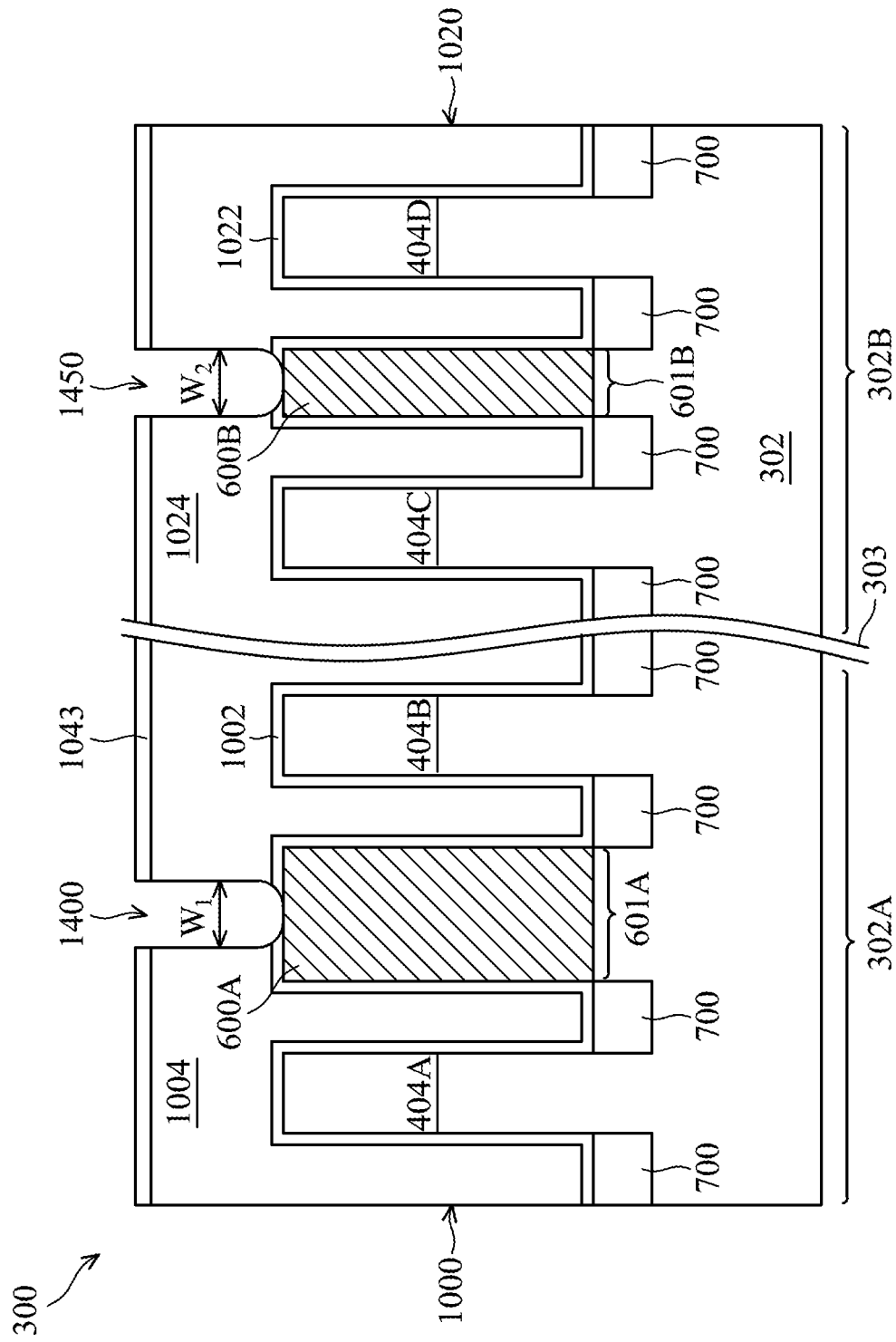

In accordance with various embodiments, in the I/O area 302A, the gate cut trench 1400 may be formed to have a width (along the lengthwise direction of the dummy gate structure 1000), $W_1$, which is approximately equal to the width 601A of the dummy fin 601A (as illustrated in FIGS. 14A-B), or less than the width 601A of the dummy fin 601A (as illustrated in FIGS. 14C-D). In the core area, the gate cut trench 1450 may be formed to have a width (along the lengthwise direction of the dummy gate structure 1020), $W_2$, which is approximately equal to the width 601B of the dummy fin 601B (as illustrated in FIGS. 14A-D). Whether the width $W_1$ of the gate cut trench 1400 in the I/O area 302A is equal to or less than the width 601A of the dummy fin 600A may be determined based on whether the width 601A is greater than a predefined threshold. For example, if the width 601A is greater than the threshold, the gate cut trench 1400 may be formed to have its width less than the width 601A (e.g., FIGS. 14C-D); and if the width 601A is less than or equal to the threshold, the gate cut trench 1400 may be formed to have its width equal to the width 601A (e.g., FIGS. 14A-B). In certain process nodes (e.g., 5 nm), the threshold may be about 50 nm. However, it should be understood that the threshold can change according to the process nodes.

In some embodiments, each of the gate cut trenches 1400 and 1450 may be formed to have a non-tapered profile. For example in FIGS. 14A and 14C, the gate cut trenches 1400 and 1450 each have its sidewalls perpendicular to its bottom surface, e.g., the exposed top surfaces of the dummy fins 600A-B. As such, the width $W_1$ of the gate cut trench 1400 may be defined as a distance globally separating the sidewalls of the gate cut trench 1400; and the width $W_2$ of the gate cut trench 1450 may be defined as a distance globally separating the sidewalls of the gate cut trench 1450. In some other embodiments, each of the gate cut trenches 1400 and 1450 may be formed to have a tapered profile. For example in FIGS. 14B and 14D, the gate cut trenches 1400 and 1450 each have its sidewalls connected to its bottom surface that has a curvature-based or edge-based profile. As such, the width $W_1$ of the gate cut trench 1400 may be defined as a distance separating the sidewalls of the gate cut trench 1400 that excludes the bottom surface; and the width $W_2$ of the gate cut trench 1450 may be defined as a distance separating the sidewalls of the gate cut trench 1450 that excludes the bottom surface.

Figure 15A:
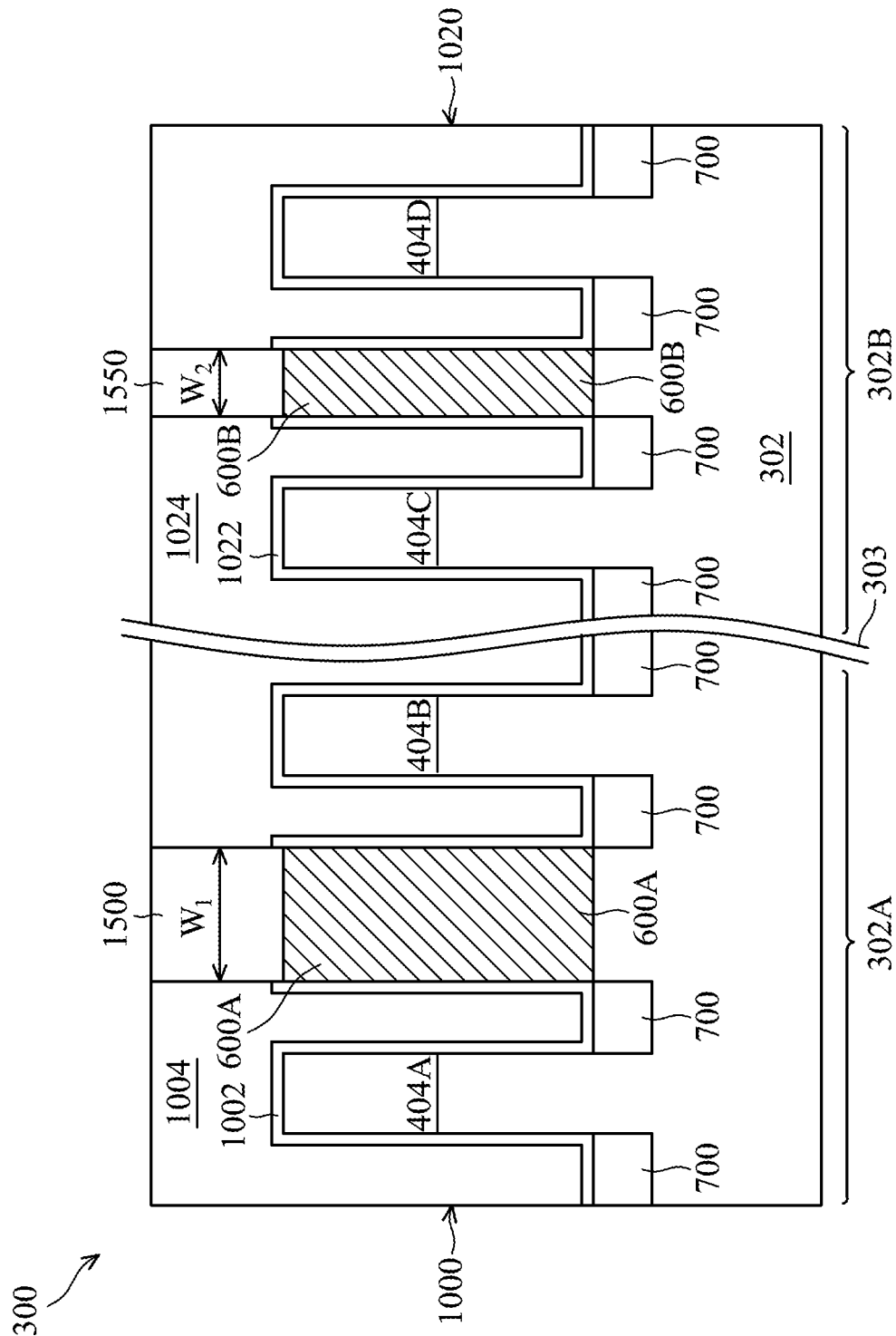
Figure 15B:
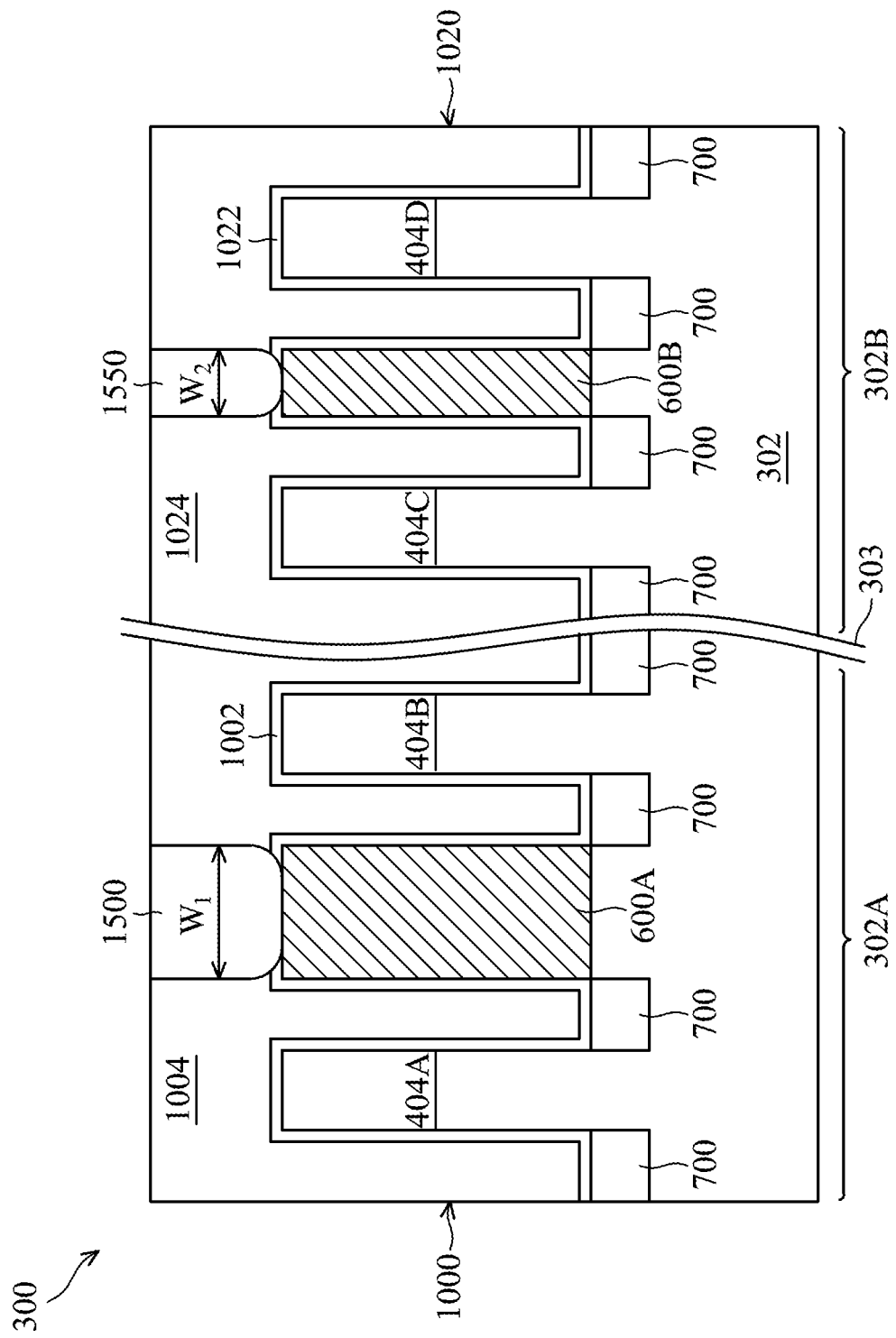
Figure 15C:
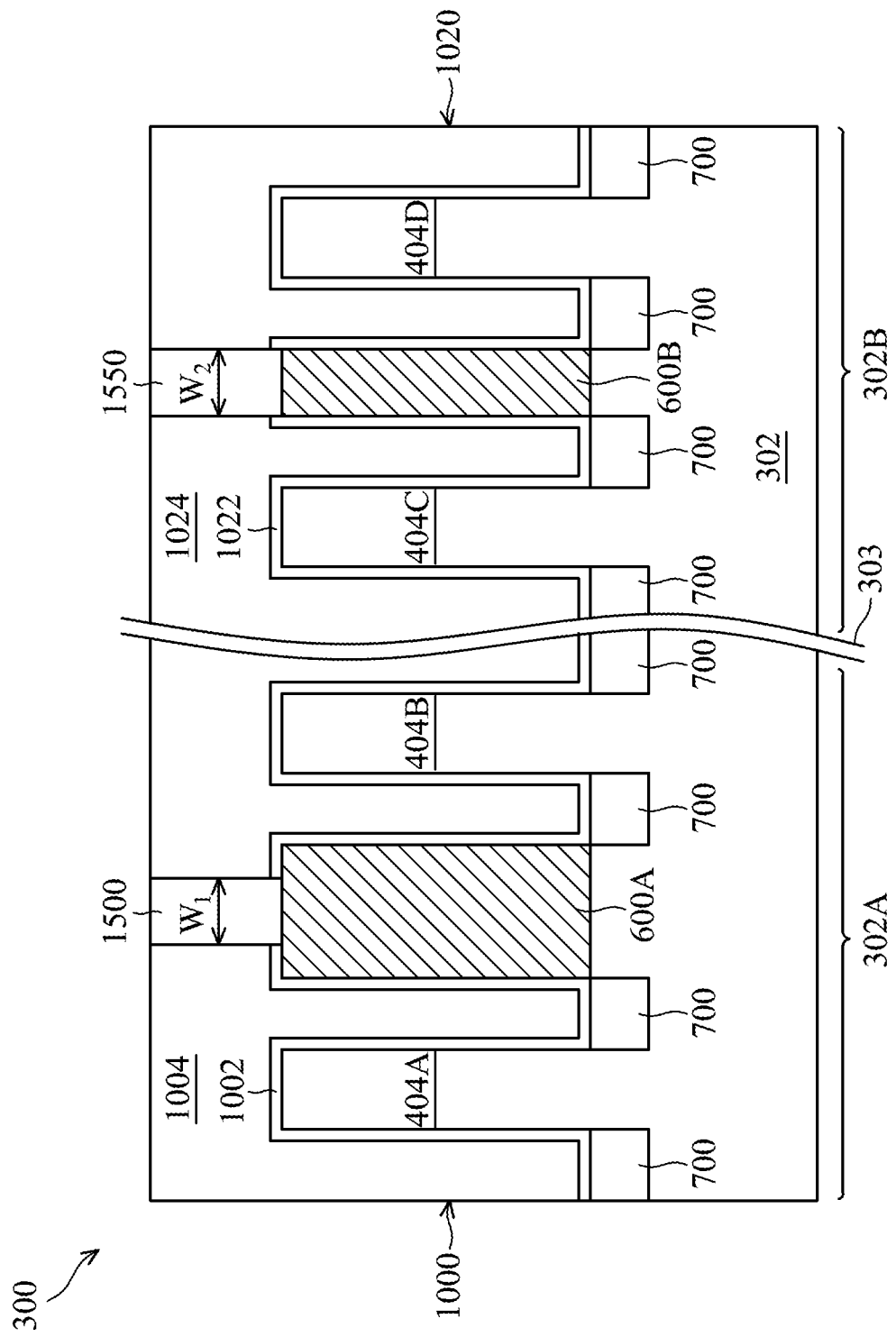
Figure 15D:
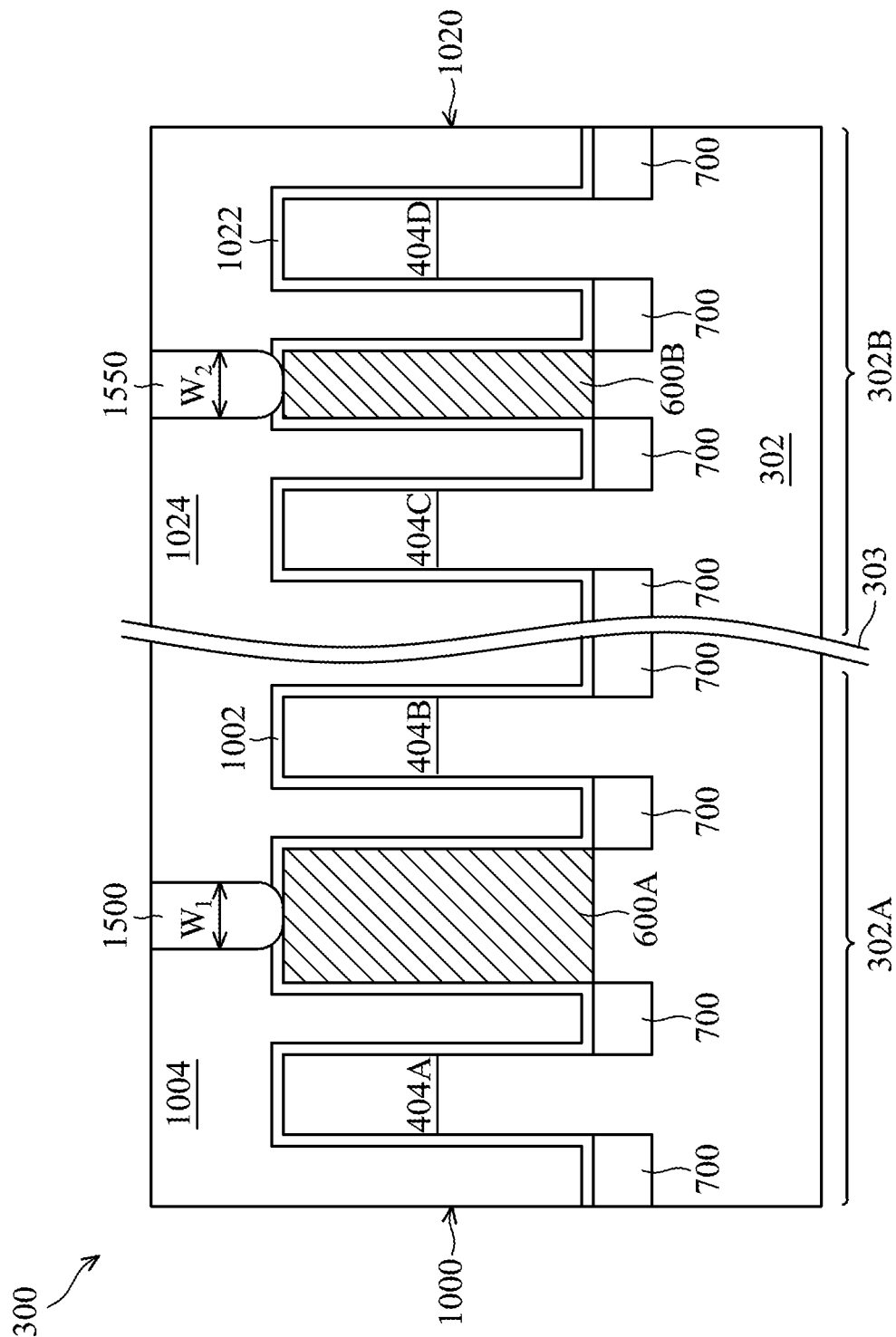

Corresponding to operation 220 of FIG. 2, FIG. 15A is a cross-sectional view of the FinFET device 300 including a gate isolation structure 1500 in the I/O area 302A and a gate isolation structure 1550 in the core area 302B at one of the various stages of fabrication. The gate isolation structures 1500 and 1550 shown in FIG. 15A are formed based on the gate cut trenches 1400 and 1450 shown in FIG. 14A. FIGS. 15B, 15C, and 15D illustrate cross-sectional views of the FinFET device 300 in which the gate isolation structures 1500 and 1550 are formed based on the gate cut trenches 1400 and 1450 shown in FIGS. 14B, 14C, and 14D, respectively. The cross-sectional views of FIGS. 15A-D are each cut along the lengthwise direction of the dummy gate structures 1000 and 1020 of the FinFET device 300 (e.g., cross-section B-B indicated in FIG. 1).

The gate isolation structures 1500 and 1550 are formed by filling the gate cut trenches 1400 and 1450 (FIGS. 14A-D), respectively, with a dielectric material. As such, the gate isolation structures 1500 and 1550 can inherit the profiles (or dimensions) of the gate cut trenches 1400 and 1450, respectively. For example in FIG. 15A, the gate isolation structure 1500 can have a non-tapered profile, with the width $W_1$ that is about equal to the width 601A of the dummy fin 600A, and the gate isolation structure 1550 can have a non-tapered profile, with the width $W_2$ that is about equal to the width 601B of the dummy fin 600B. For example in FIG. 15B, the gate isolation structure 1500 can have a tapered profile, with the width $W_1$ that is about equal to the width 601A of the dummy fin 600A, and the gate isolation structure 1550 can have a tapered profile, with the width $W_2$ that is about equal to the width 601B of the dummy fin 600B. For example in FIG. 15C, the gate isolation structure 1500 can have a non-tapered profile, with the width $W_1$ that is less than the width 601A of the dummy fin 600A, and the gate isolation structure 1550 can have a non-tapered profile, with the width $W_2$ that is about equal to the width 601B of the dummy fin 600B. For example in FIG. 15D, the gate isolation structure 1500 can have a tapered profile, with the width $W_1$ that is less than the width 601A of the dummy fin 600A, and the gate isolation structure 1550 can have a tapered profile, with the width $W_2$ that is about equal to the width 601B of the dummy fin 600B.

The dielectric material that is used to form the gate isolation structures 1500 and 1550 may include, for example, silicon oxide, silicon nitride, silicon oxynitride, silicon carbide, silicon carbonitride, silicon oxycarbonitride, silicon oxycarbide, or combinations thereof. The gate isolation structures 1500 and 1550 can be formed by depositing the dielectric material in the gate cut trenches 1400 and 1450, respectively, using any suitable method, such as CVD, PECVD, or FCVD. After the deposition, a CMP may be performed to remove any excess dielectric material from the remaining dummy gate structures 1000 and 1020.

Although the examples of FIGS. 15A-D show that the gate isolation structures 1500 and 1550 respectively fill the gate cut trenches 1400 and 1450 with a single dielectric piece (which can include one or more dielectric materials listed above), it is understood that the gate isolation structures 1500 and 1550 can each include multiple pieces. Each of the pieces may include, for example, silicon oxide, silicon nitride, silicon oxynitride, silicon carbide, silicon carbonitride, silicon oxycarbonitride, silicon oxycarbide, or combinations thereof. For example, the gate isolation structures 1500 and 1550 may each include a first piece, which is formed as a conformal layer lining the respective gate cut trench, and a second piece, which fills the gate cut trench with the first piece coupled therebetween. In another example, the gate isolation structures 1500 and 1550 may each include a first piece, which fills a lower portion of the respective gate cut trench, and a second piece, which fills an upper portion of the gate cut trench.

Figure 16A:
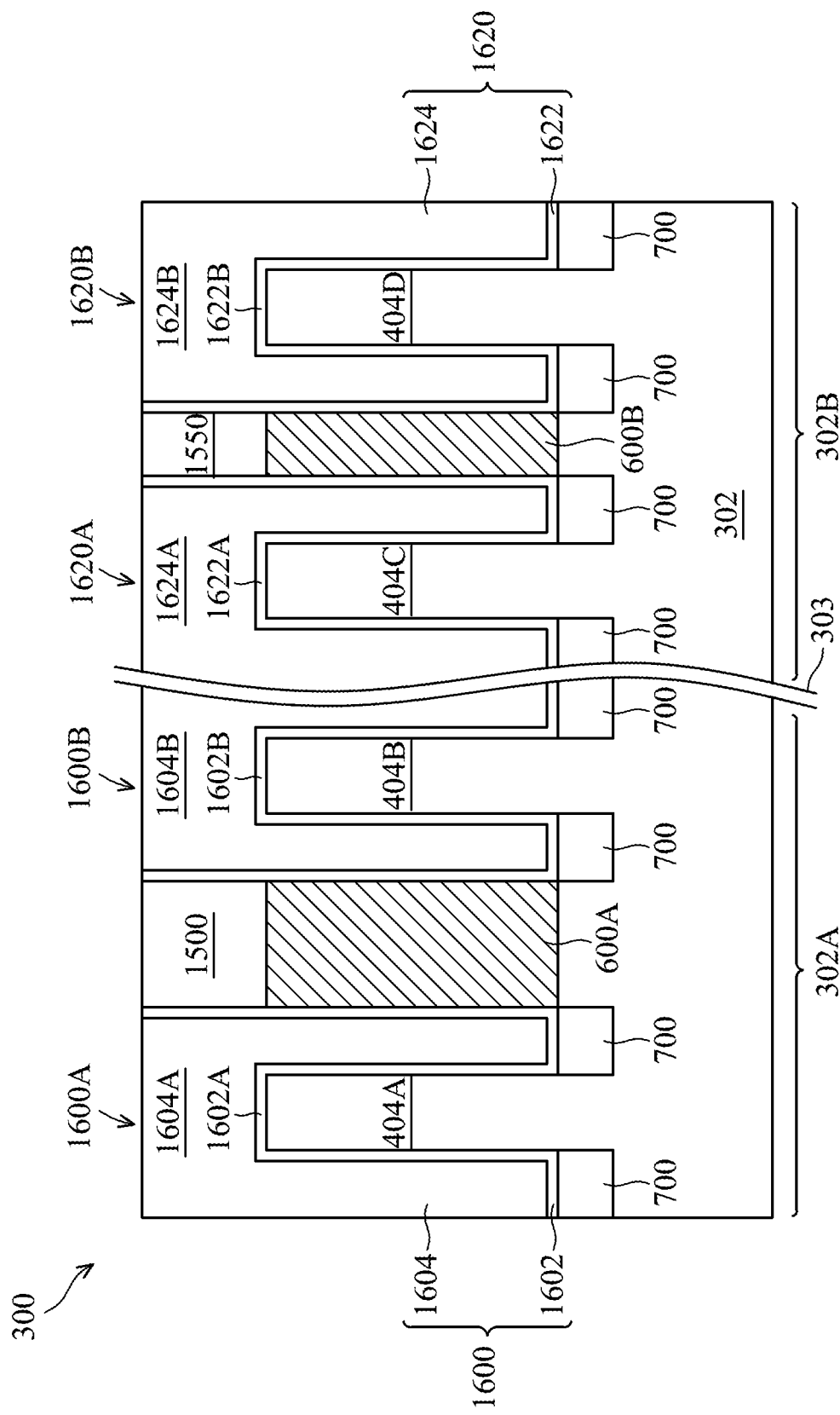
Figure 16B:
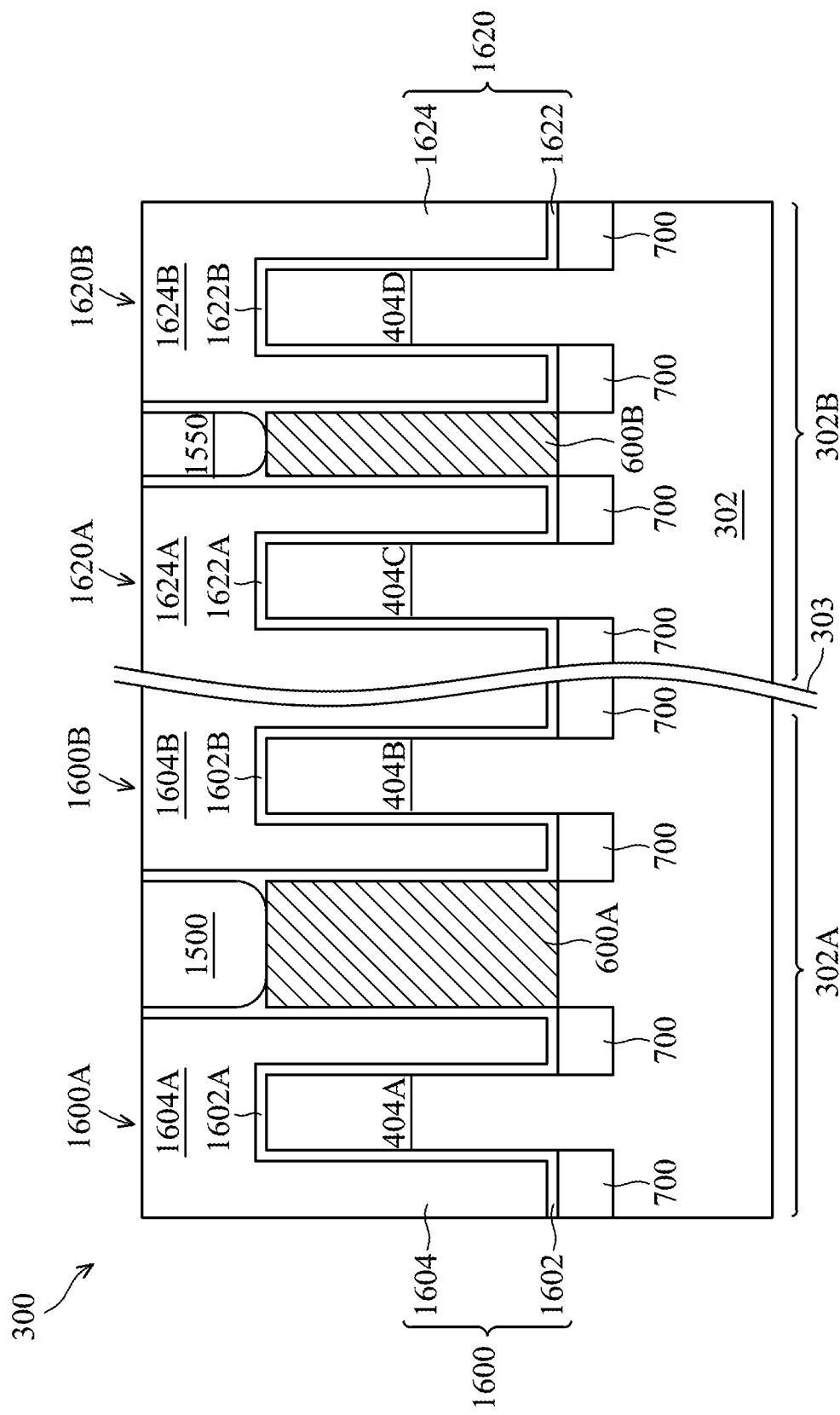
Figure 16C:
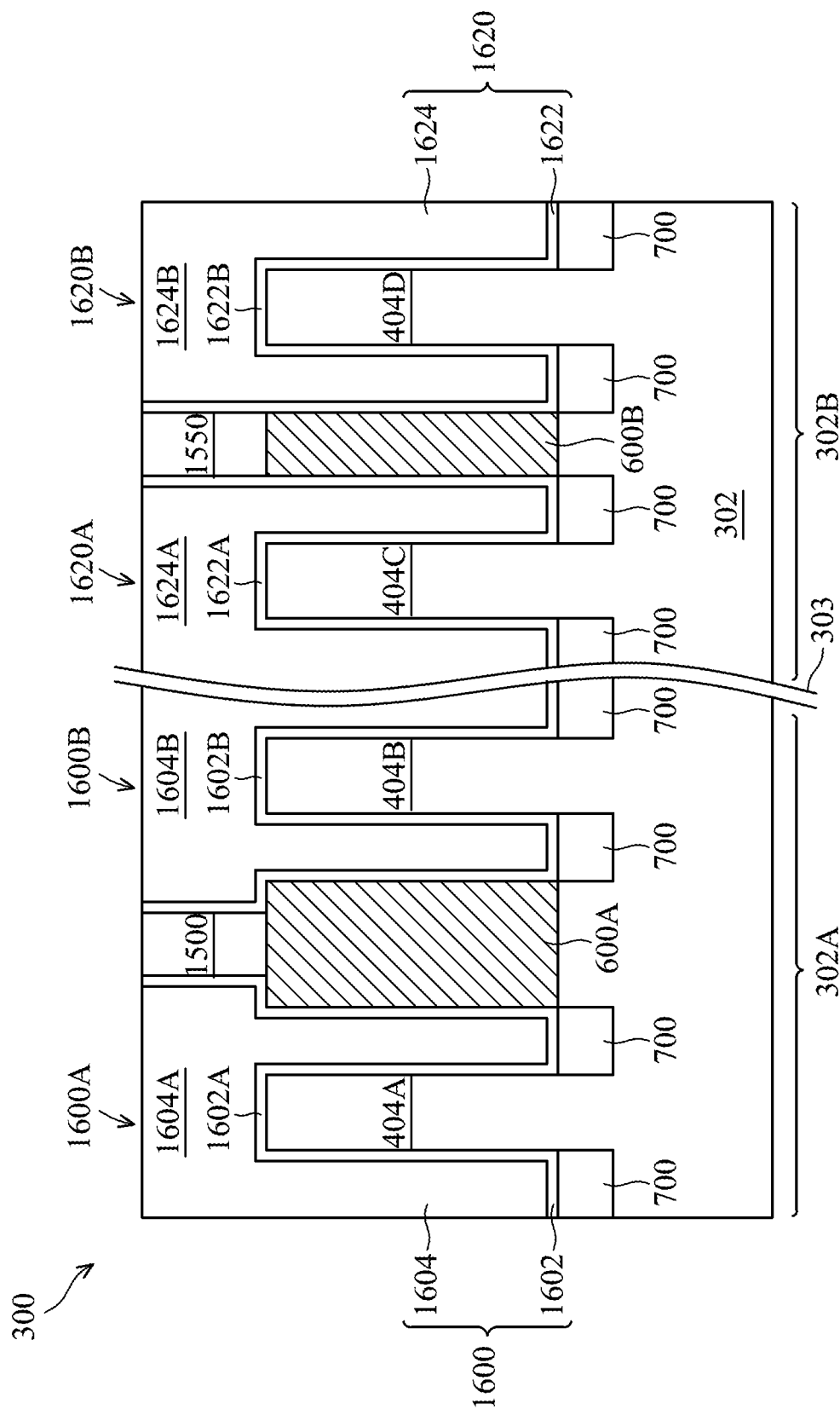
Figure 16D:
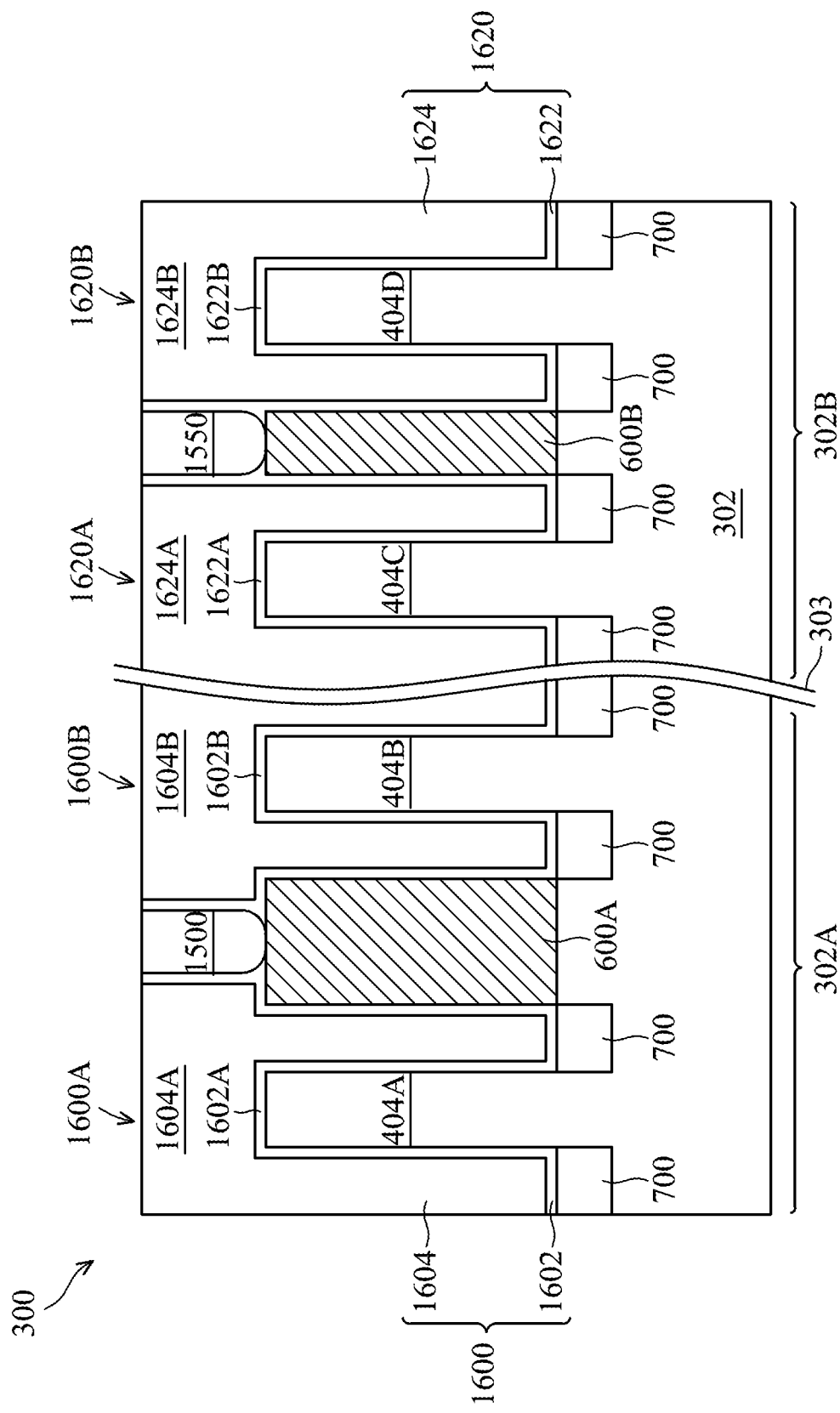

Corresponding to operation 222 of FIG. 2, FIG. 16A is a cross-sectional view of the FinFET device 300 including an active gate structure 1600 in the I/O area 302A and an active gate structure 1620 in the core area 302B at one of the various stages of fabrication. The active gate structures 1600 and 1620 shown in FIG. 16A are formed based on the cross-sectional view of the FinFET device 300 show in FIG. 15A. FIGS. 16B, 16C, and 16D illustrate cross-sectional views of the FinFET device 300 based on the cross-sectional views shown in FIGS. 15B, 15C, and 15D, respectively. The cross-sectional view of FIGS. 16A-D are each cut along the lengthwise direction of the active gate structures 1600 and 1620 of the FinFET device 300 (e.g., cross-section B-B indicated in FIG. 1).

The active gate structure 1600 may be formed by replacing the dummy gate structure 1000 (FIGS. 15A-D); and the active gate structure 1620 may be formed by replacing the dummy gate structure 1020 (FIGS. 15A-D). As illustrated, the active gate structure 1600 may include two portions 1600A and 1600B that are separated by the gate isolation structure 1500 and the dummy fin 600A; and the active gate structure 1620 may include two portions 1620A and 1620B that are separated by the gate isolation structure 1550 and the dummy fin 600B. The portion 1600A can overlay the active fin 404A; the portion 1600B can overlay the active fin 404B; the portion 1620A can overlay the active fin 404C; and the portion 1620B can overlay the active fin 404D.

After the active gate structures 1600 and 1620 are formed, the FinFET device 300 can include a number of transistors. For example, a first active transistor, adopting the active fin 404A as its conduction channel and portion 1600A as its active gate structure, may be formed; a second active transistor, adopting the active fin 404B as its conduction channel and portion 1600B as its active gate structure, may be formed; a third active transistor, adopting the active fin 404C as its conduction channel and portion 1620A as its active gate structure, may be formed; a fourth active transistor, adopting the active fin 404D as its conduction channel and portion 1620B as its active gate structure, may be formed. Further, the first and second transistors, formed in the I/O area 302A, may be each configured as an I/O transistor; and the third and fourth transistors, formed on the core area 302B, may be each configured as a core transistor.

The active gate structures 1600 and 1620 can each include a gate dielectric layer (e.g., 1602, 1622), a metal gate layer (1622, 1624), and one or more other layers that are not shown for clarity. For example, each of the active gate structures 1600 and 1620 may further include a capping layer and a glue layer. The capping layer can protect the underlying work function layer from being oxidized. In some embodiments, the capping layer may be a silicon-containing layer, such as a layer of silicon, a layer of silicon oxide, or a layer of silicon nitride. The glue layer can function as an adhesion layer between the underlying layer and a subsequently formed gate electrode material (e.g., tungsten) over the glue layer. The glue layer may be formed of a suitable material, such as titanium nitride.

The gate dielectric layers 1602 and 1622 are each deposited (e.g., conformally) in a corresponding gate trench to surround (e.g., straddle) one or more fins. For example in FIGS. 16A-D, the gate dielectric layer of the portion 1600A (sometimes referred to as "gate dielectric layer 1602A") is deposited in a gate trench that is formed by removing a portion of the dummy gate structure 1000 (e.g., the remaining dummy gate dielectric 1102 and dummy gate 1104) on the left-hand side of the dummy fin 600A. The gate dielectric layer 1602A can overlay the top surfaces and the sidewalls of the active fin 404A, one of the sidewalls of the dummy fin 600A, and one of the sidewalls of the gate isolation structure 1500. The gate dielectric layer of the portion 1600B (sometimes referred to as "gate dielectric layer 1602B") is deposited in a gate trench that is formed by removing a portion of the dummy gate structure 1000 (e.g., the remaining dummy gate dielectric 1002 and dummy gate 1004) on the right-hand side of the dummy fin 600A. The gate dielectric layer 1602B can overlay the top surfaces and the sidewalls of the active fin 404B, the other of the sidewalls of the dummy fin 600A, and the other of the sidewalls of the gate isolation structure 1500. The gate dielectric layer of the portion 1620A (sometimes referred to as "gate dielectric layer 1622A") is deposited in a gate trench that is formed by removing a portion of the dummy gate structure 1020 (e.g., the remaining dummy gate dielectric 1022 and dummy gate 1024) on the left-hand side of the dummy fin 600B. The gate dielectric layer 1622A can overlay the top surfaces and the sidewalls of the active fin 404C, one of the sidewalls of the dummy fin 600B, and one of the sidewalls of the gate isolation structure 1550. The gate dielectric layer of the portion 1620B (sometimes referred to as "gate dielectric layer 1622B") is deposited in a gate trench that is formed by removing a portion of the dummy gate structure 1020 (e.g., the remaining dummy gate dielectric 1022 and dummy gate 1024) on the right-hand side of the dummy fin 600B. The gate dielectric layer 1622B can overlay the top surfaces and the sidewalls of the active fin 404D, the other of the sidewalls of the dummy fin 600B, and the other of the sidewalls of the gate isolation structure 1550.

The gate dielectric layers 1602 and 1622 each include silicon oxide, silicon nitride, or multilayers thereof. In example embodiments, the gate dielectric layers 1602 and 1622 each include a high-k dielectric material, and in these embodiments, the gate dielectric layers 1602 and 1622 may each have a k value greater than about 7.0, and may include a metal oxide or a silicate of Hf, Al, Zr, La, Mg, Ba, Ti, Pb, or combinations thereof. The formation methods of the gate dielectric layers 1602 and 1622 may include molecular beam deposition (MBD), atomic layer deposition (ALD), PECVD, and the like. A thickness of each of the gate dielectric layers 1602 and 1622 may be between about 8 angstroms (Å) and about 20 Å, as an example.

The metal gate layers 1604 and 1627 may each be formed over the respective gate dielectric layer. The metal gate layer of the portion 1600A (sometimes referred to as "metal gate layer 1604A") is deposited in the gate trench over the gate dielectric layer 1602A; the metal gate layer of the portion 1600B (sometimes referred to as "metal gate layer 1604B") is deposited in the gate trench over the gate dielectric layer 1602B; the metal gate layer of the portion 1620A (sometimes referred to as "metal gate layer 1624A") is deposited in the gate trench over the gate dielectric layer 1622A; and the metal gate layer of the portion 1620B (sometimes referred to as "metal gate layer 1624B") is deposited in the gate trench over the gate dielectric layer 1622B.

The metal gate layers 1604 and 1624 may each be a P-type work function layer, an N-type work function layer, multi-layers thereof, or combinations thereof, in some embodiments. Accordingly, the metal gate layers 1604 and 1624 may each be referred to as a work function layer, in some embodiments. In the discussion herein, a work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof.

A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process. The thickness of a P-type work function layer may be between about 8 Å and about 15 Å, and the thickness of an N-type work function layer may be between about 15 Å and about 30 Å, as an example.

Figure 17A:
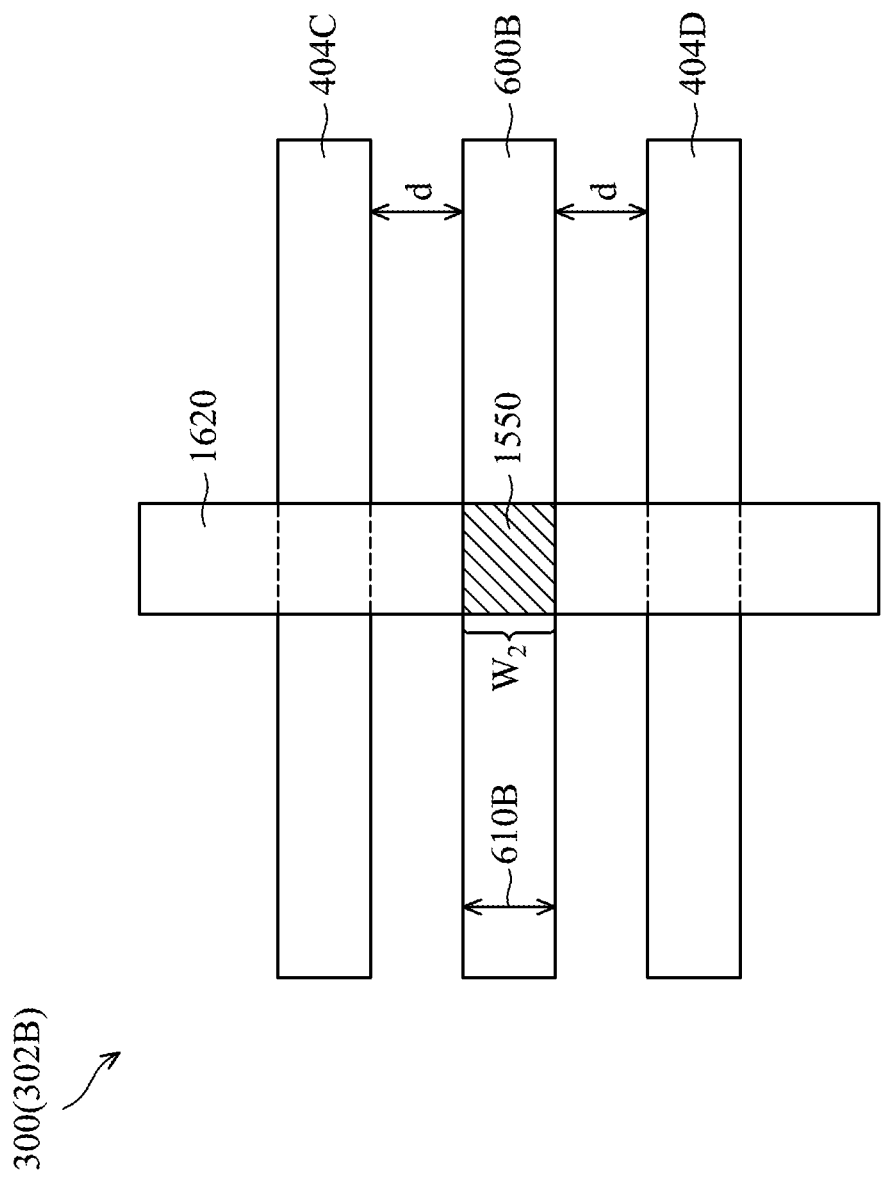
FIGS. 17A, 17B, and 17C illustrate top views of the example FinFET device (or a portion of the example FinFET device) during a certain fabrication stage, made by the method of FIG. 2, in accordance with some embodiments.
Figure 17B:
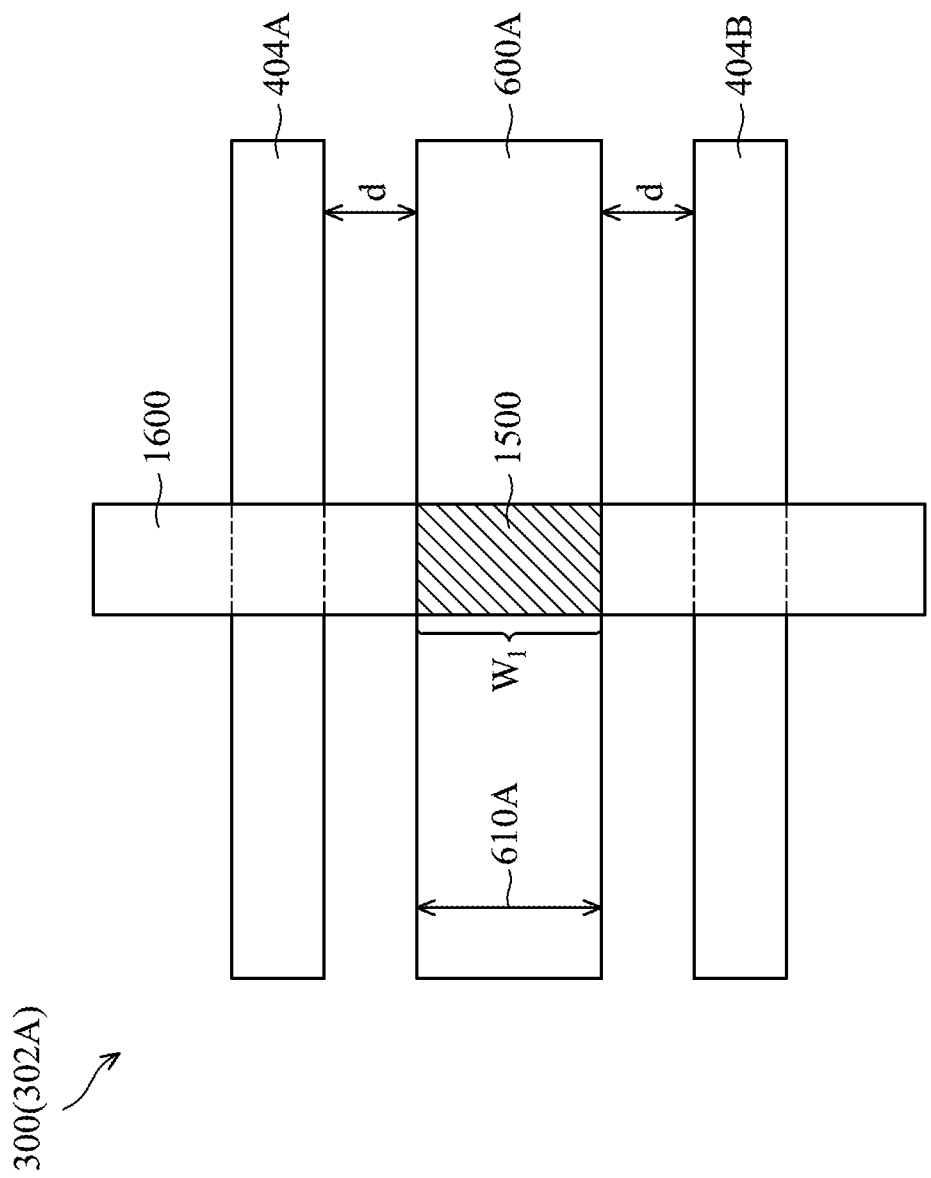
Figure 17C:
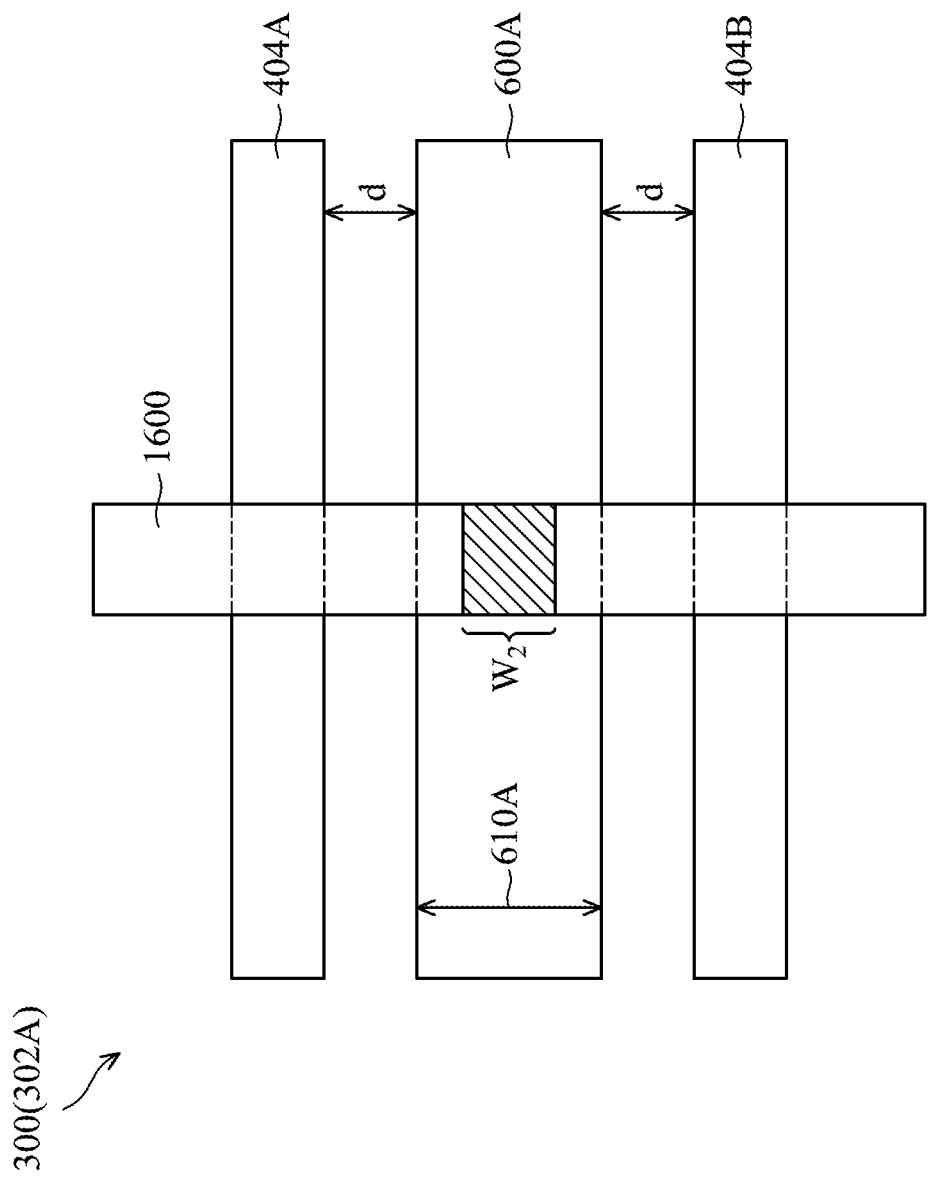

FIGS. 17A, 17B, and 17C each illustrate a top view of a portion of the FinFET device 300 after the active gate structures 1600 and/or 1620 are formed, in accordance with various embodiments. For example, FIG. 17A illustrates the top view of the portion of the FinFET device 300 in the core area 302B. As shown, the gate isolation structure 1550 separates the active gate structure 1620 into two portions that overlay the active fins 404C and 404D, respectively. When viewed from the top, the gate isolation structure 1550 has the width $W_2$ (along the lengthwise direction of the active gate structure 1620) that is about equal to the width 601B of the dummy fin 600B that is disposed between the active fins 404C and 404D. FIG. 17B illustrates the top view of the portion of the FinFET device 300 in the I/O area 302A, when the width 601A of the dummy fin 600A is less than or equal to a predefined threshold. As shown, the gate isolation structure 1500 separates the active gate structure 1600 into two portions that overlay the active fins 404A and 404B, respectively. When viewed from the top, the gate isolation structure 1500 has the width $W_1$ (along the lengthwise direction of the active gate structure 1600) that is about equal to the width 601A of the dummy fin 600A that is disposed between the active fins 404A and 404B. FIG. 17C illustrates the top view of the portion of the FinFET device 300 in the I/O area 302A, when the width 601A of the dummy fin 600A is greater than the predefined threshold. As shown, the gate isolation structure 1500 separates the active gate structure 1600 into two portions that overlay the active fins 404A and 404B, respectively. When viewed from the top, the gate isolation structure 1500 has the width $W_1$ (along the lengthwise direction of the active gate structure 1600) that is less than the width 601A of the dummy fin 600A that is disposed between the active fins 404A and 404B. As further illustrated in FIGS. 17A-C, each of the dummy fins (e.g., 600A, 600B) is spaced apart from the adjacent active fins (e.g., 404A, 404B, 404C, 404D) by a distance, "d," that ranges from about 20 angstroms to about 500 angstroms.

In one aspect of the present disclosure, a semiconductor device is disclosed. The semiconductor device includes a substrate including a first area and a second area. A first density of transistors formed in the first area is greater than a second density of transistors formed in the second area. The semiconductor device in the first area includes: a first semiconductor fin and a second semiconductor fin, both the first and second semiconductor fins extending along a first direction; a first dielectric fin that extends along the first direction and is disposed between the first and second semiconductor fins, wherein the first dielectric fin has sidewalls separated by a first distance along a second direction perpendicular to the first direction; and a first gate isolation structure vertically disposed above the first dielectric fin, wherein the first gate isolation structure has sidewalls separated by a second distance along the second direction, and wherein the first distance is equal to the second distance. The semiconductor device in the second area includes: a third semiconductor fin and a fourth semiconductor fin, both the third and fourth semiconductor fins extending along the first direction; a second dielectric fin that extends along the first direction and is disposed between the third and second fourth fins, wherein the second dielectric fin has sidewalls separated by a third distance along the second direction; and a second gate isolation structure vertically disposed above the second dielectric fin, wherein the second gate isolation structure has sidewalls separated by a fourth distance along the second direction, and wherein the fourth distance is less than the third distance.

In another aspect of the present disclosure, a semiconductor device is disclosed. The semiconductor device includes a first plurality of transistors, and a second plurality of transistors. The first plurality of transistors are configured to operate under a lower gate voltage than the second plurality of transistors. The first plurality of transistors include a first transistor having a first active gate structure and a second transistor having a second active gate structure. The first and second active gate structures are separated from each other by a first dielectric fin and a first gate isolation structure along a first direction, the first dielectric fin having a first width along the first direction, the first gate isolation structure having a second width along the first direction, the first width being equal to the second width. The second plurality of transistors includes a third transistor having a third active gate structure and a fourth transistor having a fourth active gate structure. The third and fourth active gate structures are separated from each other by a second dielectric fin and a second gate isolation structure along the first direction, the second dielectric fin having a third width along the first direction, the second gate isolation structure having a fourth width along the first direction, the third width being greater than the fourth width.

In yet another aspect of the present disclosure, a method for making a semiconductor device is disclosed. The method includes forming a first semiconductor fin and a second semiconductor fin over a substrate that both extend along a first direction. The method includes forming a dielectric fin that extends along the first direction and is disposed between the first and second semiconductor fins. The dielectric fin has a first width along a second direction perpendicular to the first direction. The method includes forming a dummy gate structure that extends along the second direction and straddles the first and second semiconductor fins and the dielectric fin. The method includes determining that the first width is greater than a predefined threshold. The method includes removing a portion of the dummy gate structure over the dielectric fin to form a trench that has a second width along the second direction. The second width is less than the first width. The method includes filling the trench with a dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate including a first area and a second area, wherein a first density of transistors formed in the first area is greater than a second density of transistors formed in the second area;
   wherein the semiconductor device in the first area comprises:
      a first semiconductor fin and a second semiconductor fin, both the first and second semiconductor fins extending along a first direction;
      a first dielectric fin that extends along the first direction and is disposed between the first and second semiconductor fins, wherein the first dielectric fin has sidewalls separated by a first distance along a second direction perpendicular to the first direction; and
      a first gate isolation structure vertically disposed above the first dielectric fin, wherein the first gate isolation structure has sidewalls separated by a second distance along the second direction, and wherein the first distance is equal to the second distance; and
   wherein the semiconductor device in the second area comprises:
      a third semiconductor fin and a fourth semiconductor fin, both the third and fourth semiconductor fins extending along the first direction;
      a second dielectric fin that extends along the first direction and is disposed between the third and fourth fins, wherein the second dielectric fin has sidewalls separated by a third distance along the second direction; and
      a second gate isolation structure vertically disposed above the second dielectric fin, wherein the second gate isolation structure has sidewalls separated by a fourth distance along the second direction, and wherein the fourth distance is less than the third distance,
   wherein the first semiconductor fin and the second semiconductor fin are configured as respective active channels of a first transistor and a second transistor in the first area and the first dielectric fin is configured as a dummy channel in the first area, wherein the third semiconductor fin and the fourth semiconductor fin are configured as respective active channels of a third transistor and a fourth transistor in the second area and the second dielectric fin is configured as a dummy channel in the second area, wherein the first and second transistors are configured for operation under a first gate voltage, and the third and fourth transistors are configured for operation under a second gate voltage, and wherein the second gate voltage is greater than the first gate voltage.

2. The semiconductor device of claim 1, in the first area, further comprising a first metal gate layer extending along the second direction, wherein the first metal gate layer includes a first portion straddling the first semiconductor fin and a second portion straddling the second semiconductor fin.

3. The semiconductor device of claim 1, in the second area, further comprising a second metal gate layer extending along the second direction, wherein the second metal gate layer includes a first portion straddling the third semiconductor fin and a second portion straddling the fourth semiconductor fin.

4. The semiconductor device of claim 1, wherein the third distance is greater than the first distance.

5. The semiconductor device of claim 1, wherein the first dielectric fin has a first width along the second direction, and the first width is greater than a predefined threshold.

6. The semiconductor device of claim 1, wherein the first area is a core area.

7. The semiconductor device of claim 1, wherein the second area is an input/output area.

8. A semiconductor device, comprising:
a first plurality of transistors; and
a second plurality of transistors, the first plurality of transistors configured to operate under a lower gate voltage than the second plurality of transistors;
wherein the first plurality of transistors comprise a first transistor having a first active gate structure and a second transistor having a second active gate structure;
wherein the first and second active gate structures are separated from each other by a first dielectric fin and a first gate isolation structure along a first direction, the first dielectric fin having a first width along the first direction, the first gate isolation structure having a second width along the first direction, the first width being equal to the second width
wherein the second plurality of transistors comprise a third transistor having a third active gate structure and a fourth transistor having a fourth active gate structure; and
wherein the third and fourth active gate structures are separated from each other by a second dielectric fin and a second gate isolation structure along the first direction, the second dielectric fin having a third width along the first direction, the second gate isolation structure having a fourth width along the first direction, the third width being greater than the fourth width.

9. The semiconductor device of claim 8, wherein the second plurality of transistors comprise a fifth transistor having a fifth active gate structure and a sixth transistor having a sixth active gate structure, and wherein the fifth and sixth active gate structures are separated from each other by a third dielectric fin and a third gate isolation structure along the first direction, the third dummy fin having a fifth width along the first direction, the third gate isolation structure having a sixth width along the first direction, the fifth width being equal to the sixth width.

10. The semiconductor device of claim 8, wherein the first transistor includes a first semiconductor fin extending along a second direction perpendicular to the first direction and the second transistor includes a second semiconductor fin extending along the second direction, and wherein the first dielectric fin that also extends along the second direction is disposed between the first and second semiconductor fins.

11. The semiconductor device of claim 10, wherein the first active gate structure straddles the first semiconductor fin and the second active gate structure straddles the second semiconductor fin, and wherein the first and second active gate structures extend along the first direction.

12. The semiconductor device of claim 8, wherein the third transistor includes a third semiconductor fin extending along a second direction perpendicular to the first direction and the fourth transistor includes a fourth semiconductor fin extending along the second direction, and wherein the second dielectric fin that also extends along the second direction is disposed between the third and fourth semiconductor fins.

13. The semiconductor device of claim 12, wherein the third active gate structure straddles the third semiconductor fin and the fourth active gate structure straddles the third semiconductor fin, and wherein the third and fourth active gate structures extend along the first direction.

14. The semiconductor device of claim 8, wherein the first plurality of transistors and the second plurality of transistors are disposed in a first area and a second area of a substrate, respectively, and wherein a first density of transistors formed in the first area is greater than a second density of transistors formed in the second area.

15. The semiconductor device of claim 8, wherein the third distance is greater than the first distance.

16. The semiconductor device of claim 5, wherein the predefined threshold is about 50 nanometers.

17. The semiconductor device of claim 8, wherein the first width is greater than a predefined threshold.

18. The semiconductor device of claim 17, wherein the predefined threshold is about 50 nanometers.

19. The semiconductor device of claim 14, wherein the first area is a core area.

20. The semiconductor device of claim 14, wherein the second area is an input/output area.

* * * * *